(12) United States Patent
Huang et al.

(10) Patent No.: US 12,295,107 B2
(45) Date of Patent: May 6, 2025

(54) METHOD FOR MANUFACTURING AN ELECTRONIC DEVICE

(71) Applicant: InnoLux Corporation, Miao-Li County (TW)

(72) Inventors: Yu-Chia Huang, Miao-Li County (TW); Kuan-Feng Lee, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/624,158

(22) Filed: Apr. 2, 2024

(65) Prior Publication Data

US 2024/0251509 A1 Jul. 25, 2024

Related U.S. Application Data

(63) Continuation of application No. 17/407,159, filed on Aug. 19, 2021, now Pat. No. 11,974,403.

(30) Foreign Application Priority Data

Sep. 16, 2020 (CN) .......................... 202010974103.3

(51) Int. Cl.
*H05K 3/22* (2006.01)
*H05K 1/02* (2006.01)
*H05K 3/10* (2006.01)

(52) U.S. Cl.
CPC ............. *H05K 3/22* (2013.01); *H05K 1/0274* (2013.01); *H05K 1/028* (2013.01); *H05K 3/10* (2013.01); *H05K 2203/1105* (2013.01)

(58) Field of Classification Search
CPC .... H05K 3/22; H05K 3/10; H05K 2201/0108; H05K 1/0393; H05K 3/007; H05K 2201/0187; Y10T 29/49155; H01L 23/3735; H01L 27/1262
See application file for complete search history.

(56) References Cited

U.S. PATENT DOCUMENTS

| | | | | |
|---|---|---|---|---|
| 10,950,674 B2* | 3/2021 | Ouyang | ............... | H10K 50/858 |
| 11,011,714 B2* | 5/2021 | Ma | .......... | H10K 71/00 |
| 2007/0052088 A1* | 3/2007 | Tsurume | ............. | H01L 23/3735 |
| | | | | 257/E23.102 |
| 2011/0294244 A1* | 12/2011 | Hattori | ................ | H01L 27/1262 |
| | | | | 438/34 |

* cited by examiner

*Primary Examiner* — Donghai D Nguyen
(74) *Attorney, Agent, or Firm* — Winston Hsu

(57) ABSTRACT

A method for manufacturing an electronic device is disclosed. The electronic device has a first region and a transparent region. The method includes the steps of providing a flexible substrate, forming an electric circuit layer on the flexible substrate at an elevated temperature, forming an opening in the transparent region after forming the electric circuit layer, wherein the opening penetrates through a portion of the electric circuit layer, and forming a filling layer on the flexible substrate after forming the opening, wherein at least a part of the filling layer is formed in the opening to enhance a transmittance of the transparent region.

9 Claims, 20 Drawing Sheets

(A)

(B)

(C)

METHOD FOR MANUFACTURING AN ELECTRONIC DEVICE

CROSS REFERENCE TO RELATED APPLICATIONS

This application is a continuation application of U.S. application Ser. No. 17/407,159, filed on Aug. 19, 2021. The content of the application is incorporated herein by reference.

BACKGROUND OF THE DISCLOSURE

1. Field of the Disclosure

The present disclosure relates to a method for manufacturing an electronic device. More particularly, the present disclosure relates to a method for manufacturing a transparent electronic device.

2. Description of the Prior Art

Transparent electronic devices refer to the electronic devices having a degree of transparency, allowing an image or an object being visible from the other side of the electronic device. Transparent electronic devices may be applied in various fields such as building windows, car windows, interior decoration, signboards, window displays or optical devices. Flexible transparent electronic devices have drawn increasing attention for being flexible and thinner.

However, current transparent electronic devices still need to be improved. For example, how to further improve the transparency of a transparent electronic device so that the electronic device may be less observed by the users is still an important research topic in the field.

SUMMARY OF THE DISCLOSURE

One objective of the present disclosure is to provide a method for manufacturing an electronic device having an improved transparency. Particularly, the transparency of the electronic device may be improved by performing a means to increase the transmittance of a flexible substrate after forming an electric circuit layer of the electronic device, or by replacing the flexible substrate with another substrate having a higher transmittance. In this way, the transparency of the electronic device may be improved and a better visual experience may be achieved.

According to one embodiment of the present disclosure, a method for manufacturing an electronic device comprising a first region and a transparent region is disclosed, which includes the steps of providing a flexible substrate, forming an electric circuit layer on the flexible substrate at an elevated temperature, forming an opening in the transparent region after forming the electric circuit layer, wherein the opening penetrates through a portion of the electric circuit layer, and forming a filling layer on the flexible substrate after forming the opening, wherein at least a part of the filling layer is formed in the opening to enhance a transmittance of the transparent region.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. The drawings in this disclosure are not drawn to scale unless being specifically specified. For clarity of presentation, the drawings are simplified and some details or elements are omitted.

DETAILED DESCRIPTION

Figure 1:
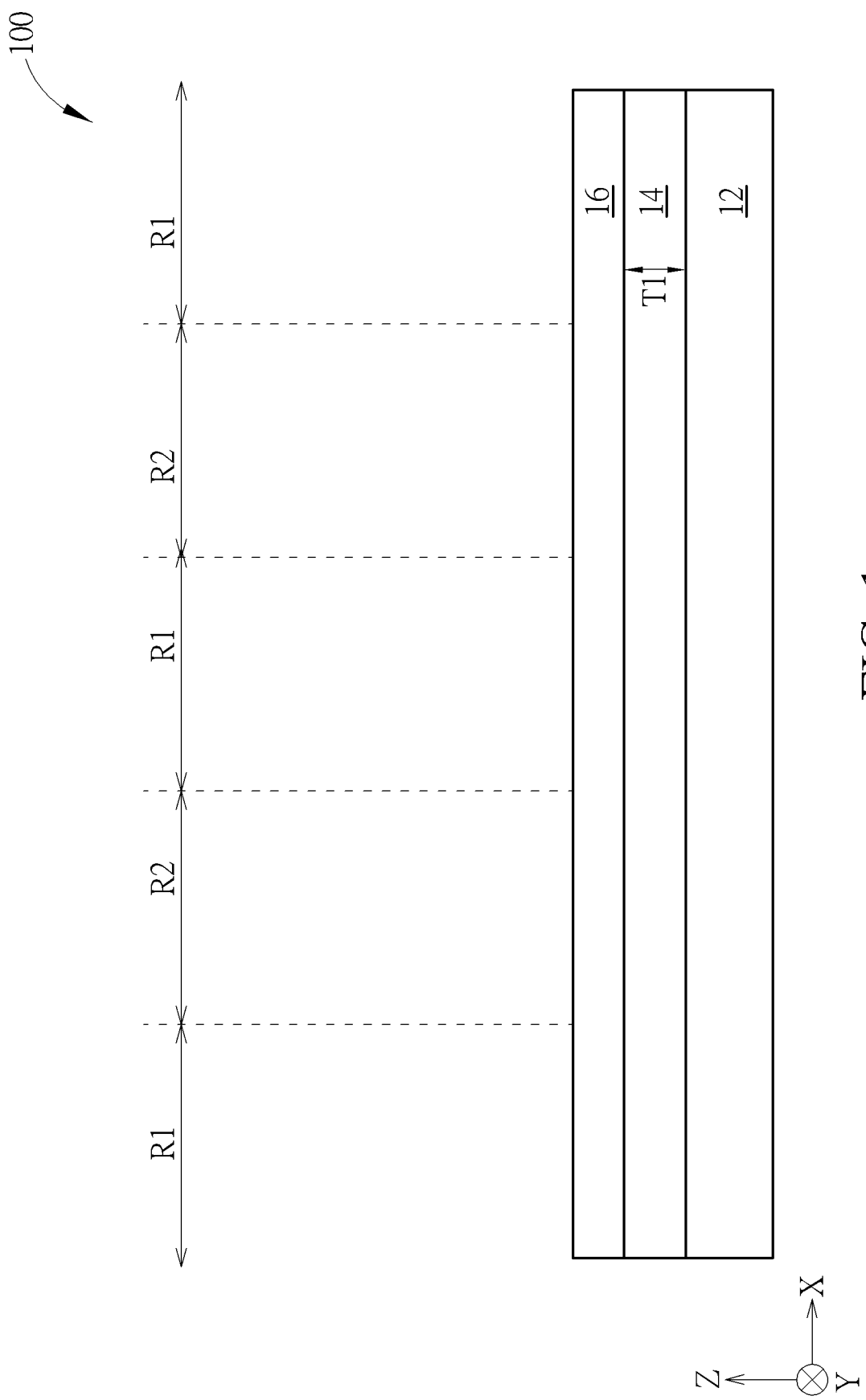
FIG. 1 is a schematic cross-sectional view of an electronic device at a manufacturing step according to various embodiments of the present disclosure.

The present disclosure may be understood by reference to the following detailed specification, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure. Other embodiments may be utilized and structural, logical, and electrical changes may be made without departing from the scope of the present invention.

Certain terms are used throughout the specification and following claims to refer to particular components. As one skilled in the art will understand, electronic equipment manufacturers may refer to a component by different names. This document does not intend to distinguish between components that differ in name but not function. In the following specification and in the claims, the terms "include", "comprise" and "have" are used in an open-ended fashion, and thus should be interpreted to mean "include, but not limited to . . . ". It will be understood that when a component is referred to as being "connected to" another component (or its variant), it may be directly connected to the "another component", or connected to the "another component" through one or more intervening components.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented. In addition, a component or layer is referred to as "on another component or layer" based their relative spatial relationship. That is, the component or layer may be above or below the other component or layer depends on the orientation of the device (orientation). The terms such as "up", "down", "front", "back", "left", "right" used in the following specification are based on the accompanying drawings for illustrative purposes, and are not used to limit the scope of the presented disclosure.

The term "substantially" refers to be within 20% of a given value or range, or within 10%, 5%, 3%, 2%, 1%, or 0.5% of a given value or range.

The terms "first", "second", "third" or the like may be used in the specification and following claims for the convenience of discriminating various components in the specification or claims. However, these terms are not used to limit these components and these components may be denominate in any other convenient way. These terms do not indicate any order of the components, and do not represent any order of a component to another component or a sequence of the manufacturing steps. Furthermore, the claims may use terminology different from that used in the specification, and may be nominated as "first", "second", "third" or the like in accordance with the order in which the components are declared in the claim. For example, a "first component" in the specification may be nominated as a "second component" in the claims.

The terms "flexible" is used in this disclosure to describe the property of being bent, curved, folded, stretched, flexed, or other similar changes in shape.

In the present disclosure, a transparency is a property of a device to permit light to pass through. The degree of the transparency of a device may be expressed as a transmittance that is a fraction or a percentage of the transmitted light power passing through the electronic device to the incident light power. For example, a device may have a transmittance ranging from 0% to 100%, wherein a transmittance of 0% incident light is completely absorbed or reflected by the device, and a transmittance of 100% indicates that the incident light may completely pass through the device.

The electronic devices provided by the embodiments of the present disclosed may include display devices, light emitting devices, antennas, sensing devices, other suitable devices, or any combinations of the above, but are not limited thereto. Examples of display devices may include non-self-emitting liquid crystal display (LCD), light emitting diode display (LED Display), electro-phoretic display (EPD), or any other types of display devices that may display images and pictures, but are not limited thereto. Examples of the electronic device may include liquid crystal, fluorescence, phosphor, light emitting diode (LED), any other suitable display mediums, or a combination of the above, but are not limited thereto. The light emitting diode (LED) may include, for example, organic light emitting diodes, inorganic light emitting diodes, sub-millimeter light emitting diodes (mini-LED), micro light emitting diodes (micro-LED), quantum-dot light emitting diodes (such as QLEDs, QDLEDs), or a combination of the above, but are not limited thereto.

The electronic devices provided by the present disclosure may be used in the fields of architecture, automobiles, interior decoration, signs, windows or optical devices, but are not limited thereto.

Figure 2:
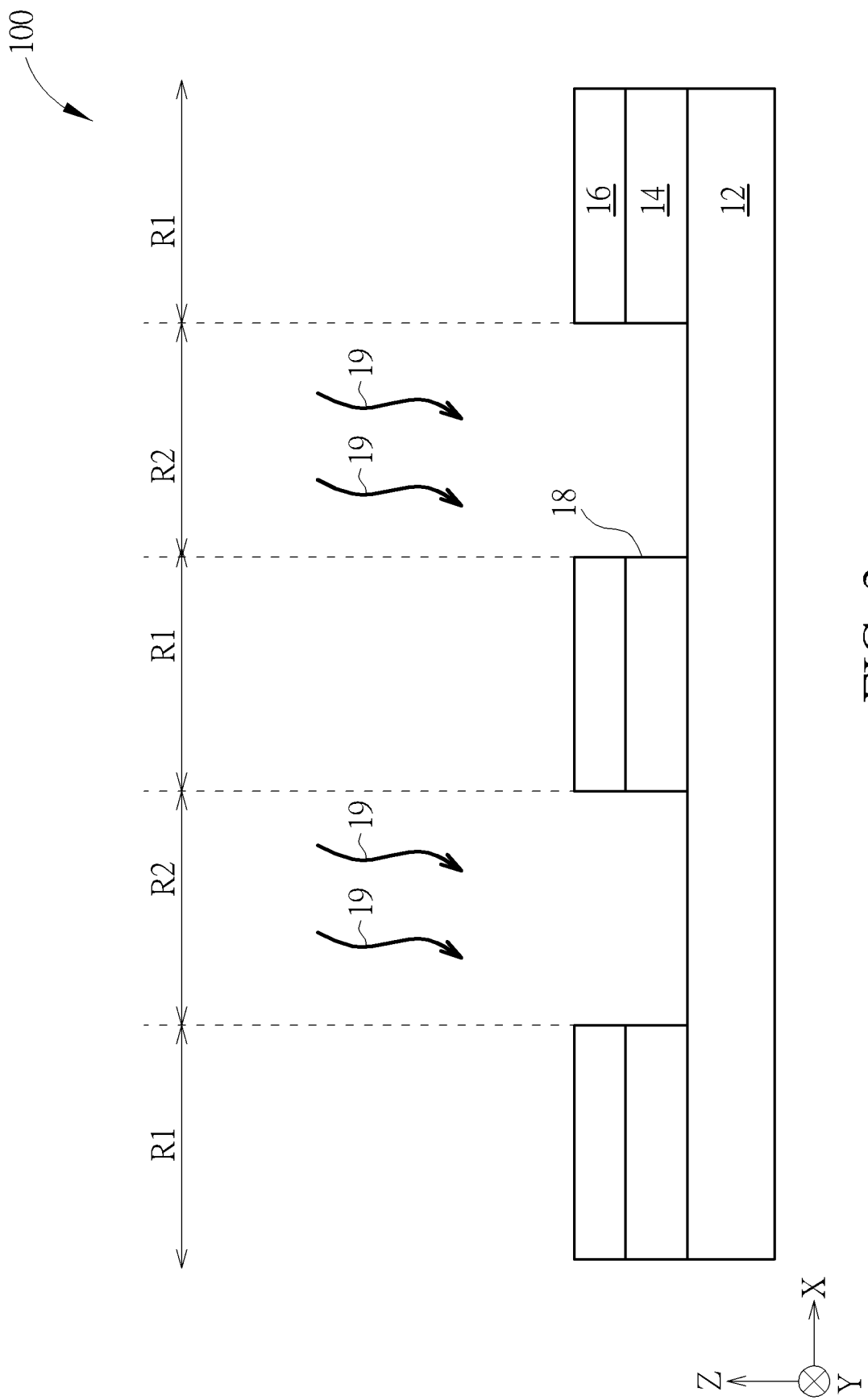
FIG. 2, FIG. 3 and FIG. 4 are schematic cross-sectional views of an electronic device at the manufacturing steps after the step shown in FIG. 1 according to a first embodiment of the present disclosure.
Figure 3:
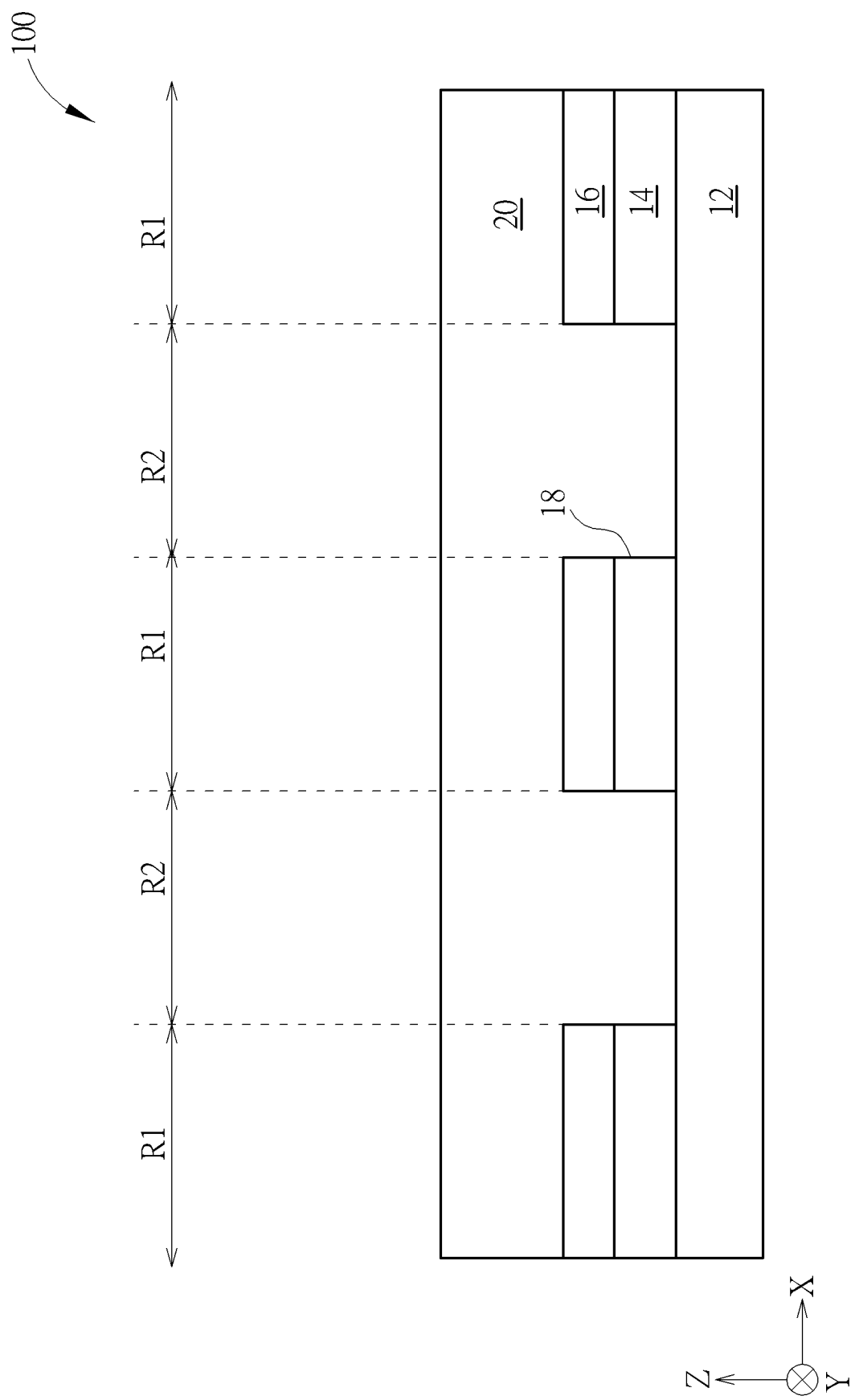
Figure 4:
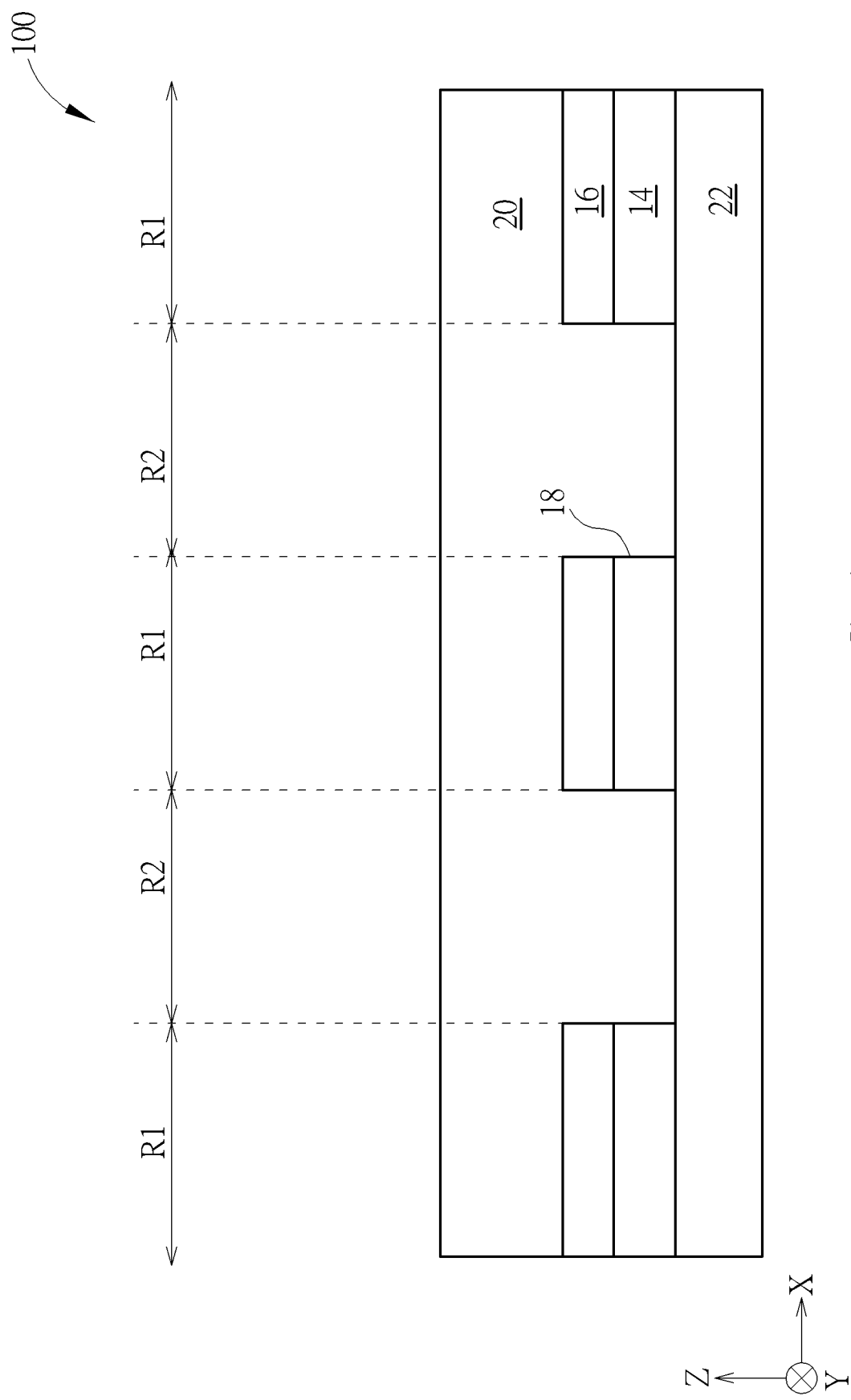

FIG. 1 is a schematic cross-sectional view of an electronic device 100 at a manufacturing step according to various embodiments of the present disclosure. FIG. 2, FIG. 3 and FIG. 4 are schematic cross-sectional views of the electronic device 100 at the manufacturing steps after the step shown in FIG. 1 according to a first embodiment of the present disclosure. Please refer to FIG. 1. The method for forming the electronic device 100 may include the steps of providing a flexible substrate 14, and forming an electric circuit layer 16 on the flexible substrate 14 at an elevated temperature, for example, approximately equal to or higher than 200° C. The flexible substrate 14 may be a substrate for forming thin-film transistors or a circuit board for forming circuit wirings, but is not limited thereto. The flexible substrate 14 and the electric circuit layer 16 may have surfaces extending along the X-direction and Y-direction, and may have a thickness along the Z-direction. The flexible substrate 14 may be made of any suitable flexible or bendable material, such as polyimide (PI), polyethylene naphthalate (PEN), polyethylene terephthalate (PET), other suitable polymers, or a combination thereof, but is not limited thereto. In some embodiments, the flexible substrate 14 may be obtained by forming a suitable material layer on a carrier substrate 12 and then baking and curing the material to obtain the flexible substrate 14. In some embodiments, the flexible substrate 14 may also be a flexible material film attached to the carrier substrate 12. The type of the flexible substrate 14 is not limited to the above examples. As shown in FIG. 1, the flexible substrate 14 may have a thickness T1.

The carrier substrate 12 is used to provide support to the flexible substrate 14 during the manufacturing process. The material of the carrier substrate 12 may include glass, quartz, sapphire, plastic, other suitable materials, or a combination of the above, but is not limited thereto. In some embodiments, a release film (not shown) may be provided between the flexible substrate 14 and the carrier substrate 12 to facilitate lift-off of the flexible substrate 14 from the carrier substrate 12 in later process. The release film (not shown) may be an amorphous silicon layer or a hydrogen-containing material layer, but is not limited thereto.

Figure 18:
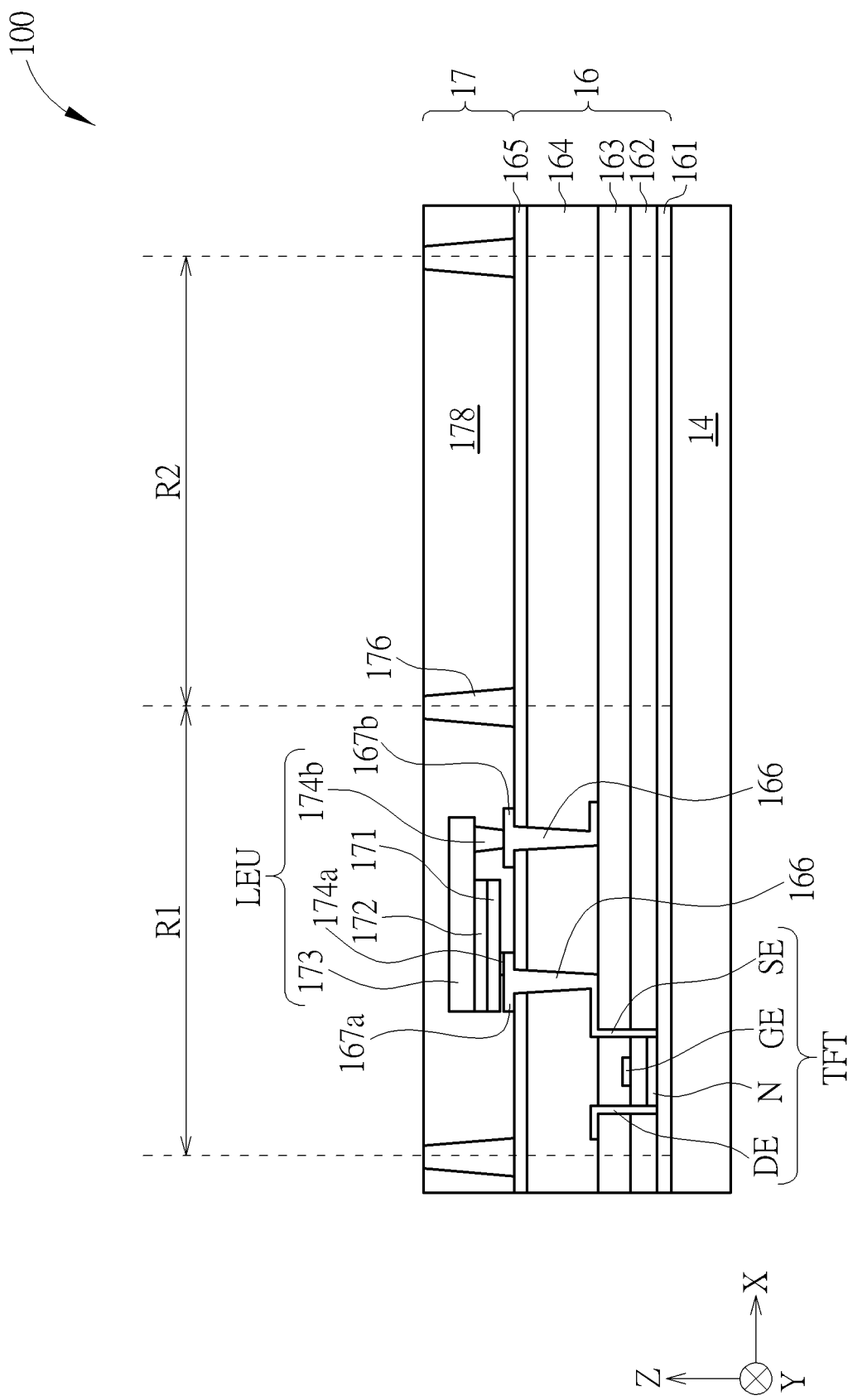
FIG. 18 is a schematic cross-sectional view of an electronic device having an electric circuit layer and a light emitting layer according to various embodiments of the present disclosure.

The electric circuit layer 16 may include circuit structures, active or passive components formed therein. Please refer to FIG. 18, in some embodiments of the presently disclosed where the electronic device is used as a display device or a light emitting device, the electric circuit layer 16 may include a driving circuit including a plurality of thin film transistors (only one thin film transistor TFT is shown in FIG. 18), and a light emitting layer 17 may be disposed on the electric circuit layer 16. The light emitting layer 17 may include a plurality of light emitting units (only one light emitting unit LEU is shown in FIG. 18) and a protecting layer 178 (may also be an optical layer or a packaging layer) on the light emitting units.

Furthermore, as shown in FIG. 18, the electronic device 100 may be divided into a plurality of first regions R1 and second regions R2 (only one first region R1 and one second region R2 are shown in FIG. 18) by the spacers 176 disposed in the light emitting layer 17. The spacers 176 may be referred to as a pixel defining layer (PDL) and may include organic dielectric materials such as acrylic polymers or/and silicone polymers, or other suitable material, but is not limited thereto. The first regions R1 is a light emitting region or a pixel region of the electronic device 100, and at least one light emitting unit LEU may be disposed in the light emitting layer 17 in the first regions R1. The light emitting unit LEU may be controlled by a corresponding driving circuit disposed in the electric circuit layer 16 in the first region R1. The second region R2 is a transparent region of the electronic device 100. In some embodiments, the light emitting layer 17 in the second region R2 may essentially include dielectric layers such as the protecting layer 178 or other dielectric layers, and no light emitting units are formed in the light emitting layer 17 in the second region R2.

To be more detailed, the electric circuit layer 16 may include a first insulating layer 161, a second insulating layer 162, a third insulating layer 163, a fourth insulating layer 164, and a fifth insulating layer 165 along a direction away from the flexible substrate 14 (for example, along the Z-direction). Said insulating layers may include an inorganic dielectric material or an organic dielectric material, respectively, wherein said inorganic dielectric material may include, for example, silicon nitride (SiNx), silicon oxide (SiOx), silicon oxynitride (SiON), aluminum oxide (Al2O3), titanium oxide (TiO$_2$), tantalum oxide (Ta$_2$O$_5$), hafnium oxide (HfO$_2$) or zirconium oxide (ZrO$_2$), or other suitable inorganic dielectric materials, but is not limited thereto. Said organic dielectric material may include acrylic resin or other suitable inorganic dielectric material, but is not limited thereto. In some embodiments, the first insulating layer 161, the second insulating layer 162, the third insulating layer 163, the fourth insulating layer 164, and the fifth insulating layer 165 may include a same dielectric material. In some embodiments, the first insulating layer 161, the second insulating layer 162, the third insulating layer 163, the fourth insulating layer 164, and the fifth insulating layer 165 may include different dielectric materials. The first insulating layer 161, the second insulating layer 162, the third insulating layer 163, the fourth insulating layer 164, and the fifth insulating layer 165 may respectively be single layered or multiple layered.

The thin film transistors in the electric circuit layer 16 may include top gate thin film transistors or bottom gate thin film transistors. For example, the thin film transistor TFT shown in FIG. 18 is a top gate thin film transistor, including a channel layer N disposed on the first insulating layer 161, a gate GE disposed on the channel layer N and separated from the channel layer N by the second insulating layer 162 (in the case, second insulating layer 162 may be referred to as a gate insulating layer). A source SE and a drain DE are disposed on the channel layer N and at two sides of the gate GE, and are through the second insulating layer 162 and the third insulating layer 163 to be electrically connected to the conductive structures 166, respectively. The channel layer N may be formed by patterning a semiconductor layer, and the material of the semiconductor layer may include metal oxide semiconductor, amorphous silicon, low temperature polycrystalline silicon (LTPS), or low temperature polycrystalline oxide (LTPO), but is not limited thereto. The material of the metal oxide semiconductor may include oxides of at least one of the metals: indium (In), gallium (Ga), tin (Sn), zirconium (Zr), vanadium (V), hafnium (Hf), cadmium (Cd), germanium (Ge), chromium (Cr), titanium (Ti), tantalum (Ta), and zinc (Zn).

The conductive structures 166 are formed in the fourth insulating layer 164 and the fifth insulating layer 165. The conductive structures 166 may be used for wiring, and/or as the interconnecting structure between the source SE of the thin film transistor TFT and the contact pad 167a and/or the interconnecting structure between the power line (not shown) and the contact pad 167b. In some embodiments, the electric circuit layer 16 may further include structures such as fan-out lines, data lines, scan lines, light emitting control lines, power lines, and ground potential lines, which are configured to provide control signals and power to the thin film transistor TFT to control the light emitting unit LEU. To simplify the drawings, these structures are not shown in FIG. 18. The materials of the conductive structures 166 may include metals such as silver, copper, aluminum, molybdenum, tungsten, gold, chromium, nickel, platinum, titanium, iridium, rhodium, indium, bismuth, alloys of the above, combinations of the above, or other metals having suitable conductivity, but are not limited thereto.

In some embodiments, the light emitting unit LEU may be a light emitting diode (LED), which may include a first semiconductor layer 171, a second semiconductor layer 173, a light emitting component 172 disposed between the first semiconductor layer 171 and the second semiconductor layer 173, a first electrode 174a that is electrically connected to the first semiconductor layer 171, and a second electrode 174b that is electrically connected to the second semiconductor layer 173. The first electrode 174a and the second electrode 174b are respectively electrically connected to the thin-film transistor TFT and the power line (not shown) through the contact pad 167a and the contact pad 167b disposed on the fifth insulating layer 165. According to an embodiment, the light emitting component 172 may include a multiple quantum well layer, but is not limited thereto.

It should be understood that the structures and/or types of the electric circuit layer 16, the light emitting layer 17, the thin film transistor TFT, and the light emitting unit LEU shown in FIG. 18 are only examples and may be adjusted in other embodiments according to design requirements. Furthermore, the light emitting layer 17 may be an optional layer in the various embodiments provided by the present disclosure. In some embodiments, a touch layer (not shown) may be disposed on the light emitting layer 17 or between the light emitting layer 17 and the electric circuit layer 16. In some embodiments, the touch layer in the second regions R2 may essentially include dielectric materials and without wiring structures or circuit components. In some embodiments, the light emitting layer 17 may be formed on a filling layer (for example, the filling layer 20 shown in FIG. 3) after forming the filling layer on the electric circuit layer 16.

It should be noted that, in some embodiments, the process for forming the electric circuit layer 16 may include performing one or multiple elevated temperature processes, such as metal oxide semiconductor deposition process for forming the electric circuit layer 16, amorphous silicon deposition process, polycrystalline silicon deposition process, insulating layer deposition process, etching process, and/or anneal process, but are not limited thereto. During the elevated temperature processes, the flexible substrate 14 and the carrier substrate 12 used to support the flexible substrate 14 will be placed in an environment or in a process chamber with an elevated temperature environment over 220° C. or between 220° C. and 240° C., so the flexible substrate 14 must be made of a heat-resistant material that is thermally stable in a during the elevated temperature processes. In some embodiments, the flexible substrate 14 may include polyimide (PI) for providing the heat-resistant property. However, the heat-resistant PI usually has a high content of benzene to improve the thermal stability, and the benzene will absorb light and emit yellow light, so that the heat-resistant flexible substrate 14 may have a yellow color and a reduced light transmittance. The flexible substrate 14 may have a first transmittance TM1. According to some embodiments of the present disclosure, the first transmittance TM1 may be approximately 70%.

Please refer to FIG. 2. After forming the electric circuit layer 16 (and the light emitting layer), an etching process 19 (such as a photolithography-etching process) may be performed to the electric circuit layer 16 and the flexible substrate 14 in the second regions R2 of the electronic device 100 to form a plurality of openings 18 in the flexible substrate 14. In some embodiments as shown in FIG. 2, the etching process 19 may etch through the flexible substrate 14. That is, the openings 18 may penetrate through the flexible substrate 14 and expose the carrier substrate 12 under the flexible substrate 14. In some embodiments, when a light emitting layer or a touch layer (not shown) are disposed on the electric circuit layer 16, the etching process 19 may etch through the light emitting layer or the touch layer in the second regions R2 of the electronic device 100.

Please refer to FIG. 3. Subsequently, a filling layer 20 is formed and covers the electric circuit layer 16 and the flexible substrate 14, and is filled into each of the openings 18 in the second regions R2. The filler layer 20 may be used to protect the electric circuit layer 16 (and the light emitting units) from the influences caused by radiations, moisture, or oxygen in the environment, so that the quality of the electronic device 100 may be improved. In some embodiments, the filling layer 20 may provide structural support for the flexible substrate 14 and the electric circuit layer 16. In some embodiments, the material of the filler layer 20 may include an organic dielectric material or an inorganic dielectric material having good light transmittance, wherein the organic dielectric material may include acrylic resin, such as polymethyl methacrylate (PMMA) or other suitable material, but is not limited thereto. The filling layer 20 may include a second transmittance TM2. According to some embodiments of the present disclosure, the second transmittance TM2 is higher than the first transmittance TM1 of the flexible substrate 14. For example, the second transmittance TM2 may be higher than 80%, or higher than 85%. By forming the openings 18 in the flexible substrate 14 in the second regions R2 of the electronic device 100 and filling the openings 18 with the filling layer 20 which has a light transmittance higher than the original light transmittance of the flexible substrate 14, the averaged light transmittance of the flexible substrate 14 may be increased and thus the electronic device 100 may overall have an improved transparency.

Please refer to FIG. 4. Subsequently, a lift-off process may be performed to remove the flexible substrate 14, the electric circuit layer 16, and the filling layer 20 from the carrier substrate 12, and then the flexible substrate 14 is attached to a supporting film 22 on a side of the flexible substrate 14 that is opposite to the electric circuit layer 16. In some embodiments, the lift-off process may be, for example, laser lift-off or mechanical lift-off, but is not limited thereto. In some embodiments, the electronic device 100 may be temporarily attached to a temporary substrate on the side of the filler layer 20 to facilitate the lift-off process of the carrier substrate 12. The material of the supporting film 22 may include a hard material or a soft material that has a high light transmittance and sufficient supporting property. For example, the supporting film 22 may include glass, quartz, sapphire, plastic, or other suitable materials, or a combination of the above, but is not limited thereto. In some embodiments, the supporting film 22 may include plastic such as polyimide (PI), polycarbonate (PC), polyethylene terephthalate (PET), or other suitable plastic materials. In some embodiments, the electronic device 100 may be applied in the field of architecture or automobiles, the supporting film 22 may include metal particles or a multi-layer structure to provide heat shielding effect. The supporting film 22 may have a third transmittance TM3. According to some embodiments of the present disclosure, the third transmittance TM3 may be higher than 80%, or higher than 85%. In some embodiments, the flexible substrate 14 may be attached to the supporting film 22 by using an adhesive layer (not shown).

Please continue referring to FIG. 4. The first regions R1 of the electronic device 100 may have a fourth transmittance TM4, which is determined by the supporting film 22, the flexible substrate 14, the electric circuit layer 16, the filling layer 20, and/or other layers in the first regions R1 of the electronic device 100. The fourth transmittance TM4 of the first regions R1 of the electronic device 100 may be obtained by providing an incident light to the first regions R1 of the electronic device 100 along the Z direction. The incident light enters from one side of the electronic device 100, through the flexible substrate 14, the electric circuit layer 16, the filling layer 20, and/or other layers in the first regions R1 of the electronic device 100, and then exits from the other side of the electronic device 100 as a transmitted light. The percentage of the transmitted light flux to the incident light flux (or the percentage of the integral value of the spectrum of the transmitted light to the integral value of the spectrum of the incident light within a same wavelength range) is the fourth transmittance TM4. The incident light may include visible lights having wavelengths between 380 nm and 780 nm, or ultraviolet lights having wavelengths smaller than 365 nm. For example, when the incident light includes visible lights having wavelengths between 380 nm and 780 nm, the fourth transmittance TM4 is the percentage of the transmitted light flux in the wavelength range between 380 nm and 780 nm to the incident light flux (or the percentage of the integral value of the spectrum of the transmitted light in the wavelength range between 380 nm and 780 nm to the integral value of the spectrum of the incident light)

The second regions R2 of the electronic device 100 may have a fifth transmittance TM5, which is determined by the supporting film 22, the filling layer 20, and/or other layers in the second regions R2 of the electronic device 100. The fifth transmittance TM5 of the second regions R2 of the electronic device 100 may be obtained by providing an incident light to the second regions R2 of the electronic device 100 along the Z direction. The incident light enters from one side of the electronic device 100, through the supporting film 22, the filling layer 20, and/or other layers in the second regions R2 of the electronic device 100, and then exits from the other side of the electronic device 100 as a transmitted light. The percentage of the transmitted light flux to the incident light flux (or the percentage of the integral value of the spectrum of the transmitted light to the integral value of the spectrum of the incident light within a same wavelength range) is the fifth transmittance TM5. It is noteworthy that the fifth transmittance TM5 of the second regions R2 is larger than the fourth transmittance TM4 of the first regions R1.

According to an embodiment in which the electronic device 100 includes a touch layer (not shown), the touch layer may be disposed on the filling layer 20 after forming the filling layer 20, so that the touch layer would not be etched during by the etching process when forming the openings 18. In this way, the wirings may be disposed in the touch layer in the first regions R1 and the second regions R2 to provide larger design flexibility.

Figure 5:
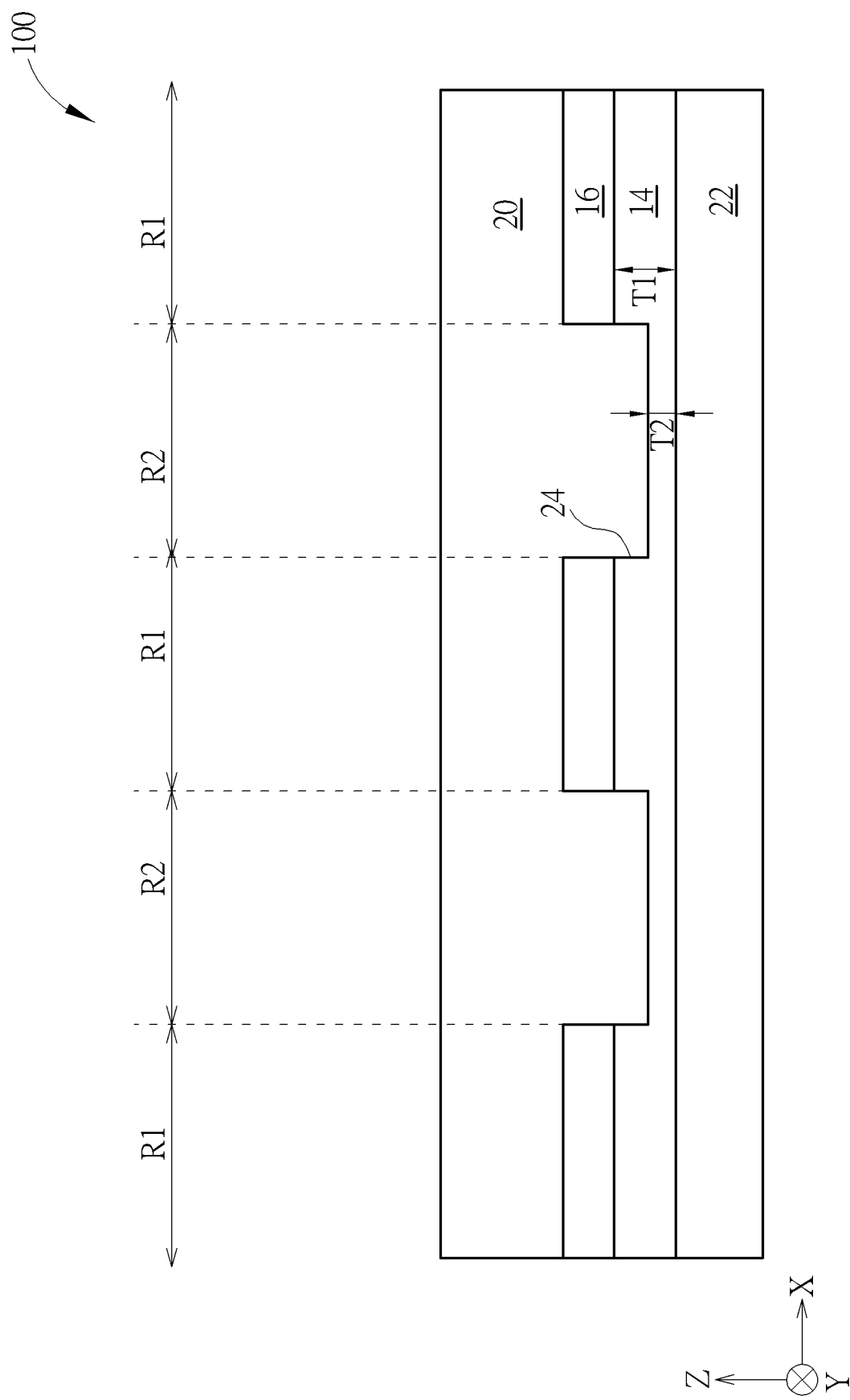
FIG. 5 is a schematic cross-sectional view of an electronic device according to a second embodiment of the present disclosure.

Please refer to FIG. 5, which is a schematic cross-sectional view of an electronic device 100 according to a second embodiment of the present disclosure. A major difference between the electronic device 100 illustrated in FIG. 5 and the electronic device 100 illustrated in FIG. 4 is that, in FIG. 5, by controlling the etching process to not etch through the entire thickness of the flexible substrate 14, a plurality of recesses 24 may be formed in the flexible substrate 14 in the second regions R2. In some embodiments, the remaining flexible substrate 14 below the recess 24 (the portion of the flexible substrate 14 between the recess 24 and the supporting film 22) may have a thickness T2. According to some embodiments, the thickness T2 may be approximately between ½ and ⅕ of the thickness T1 of the flexible substrate 14 in the first regions R1. Afterward, a filling layer 20 is formed and covers the electric circuit layer 16 and the flexible substrate 14, and is filled into each of the recesses 24 in the second regions R2. By forming the recesses 24 in the flexible substrate 14 in the second regions R2 of the electronic device 100 and filling the recesses 24 with the filling layer 20 which has a light transmittance higher than the original light transmittance of the flexible substrate 14, the averaged light transmittance of the flexible substrate 14 may be increased and thus the electronic device 100 may overall have an improved transparency. The transmittances of the first regions R1 and the second regions R2 may be obtained by the method illustrated in previous paragraphs, and will not be described herein.

Figure 6:
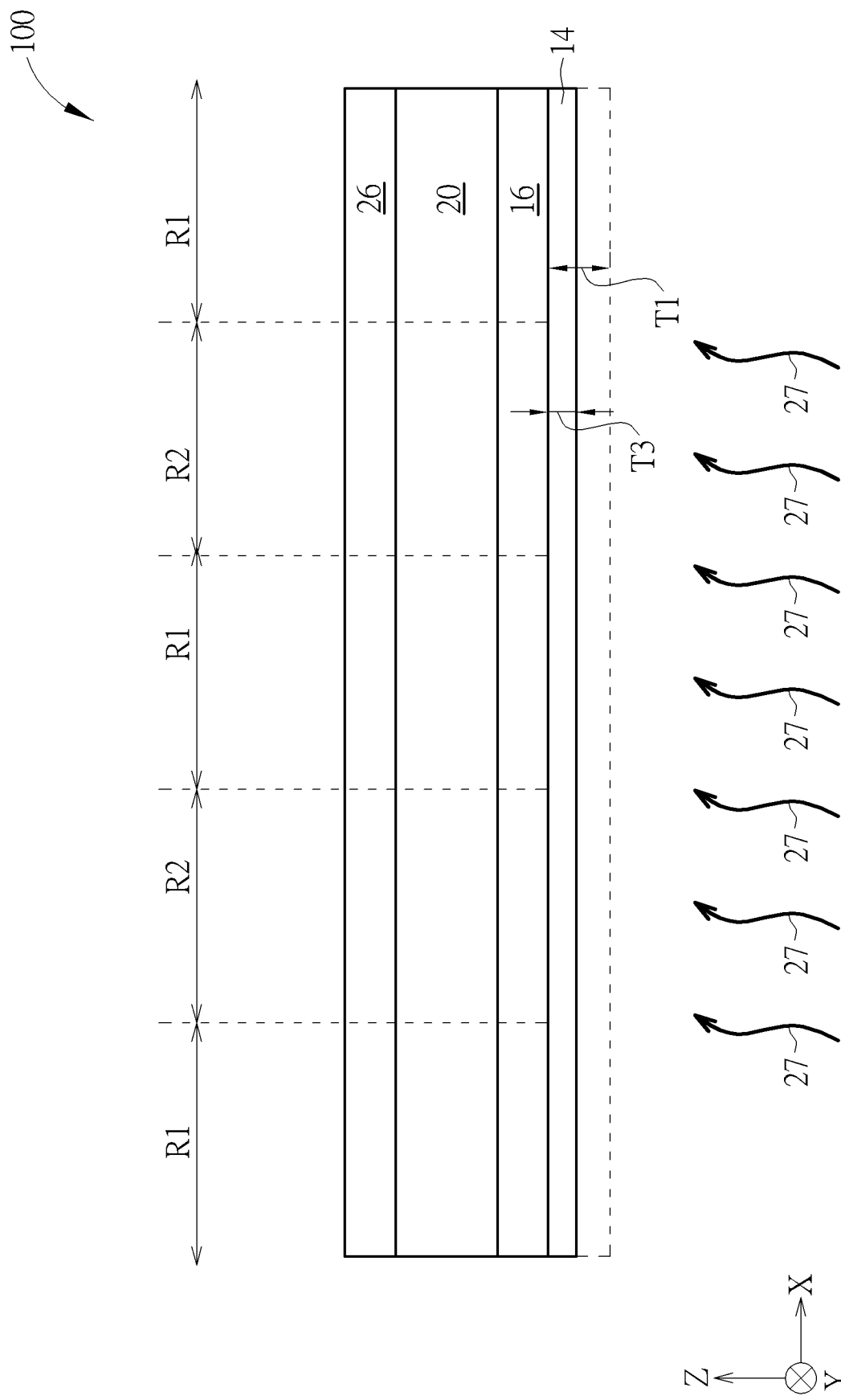
FIG. 6 and FIG. 7 are schematic cross-sectional views of an electronic device at the manufacturing steps after the step shown in FIG. 1 according to a third embodiment of the present disclosure.
Figure 7:
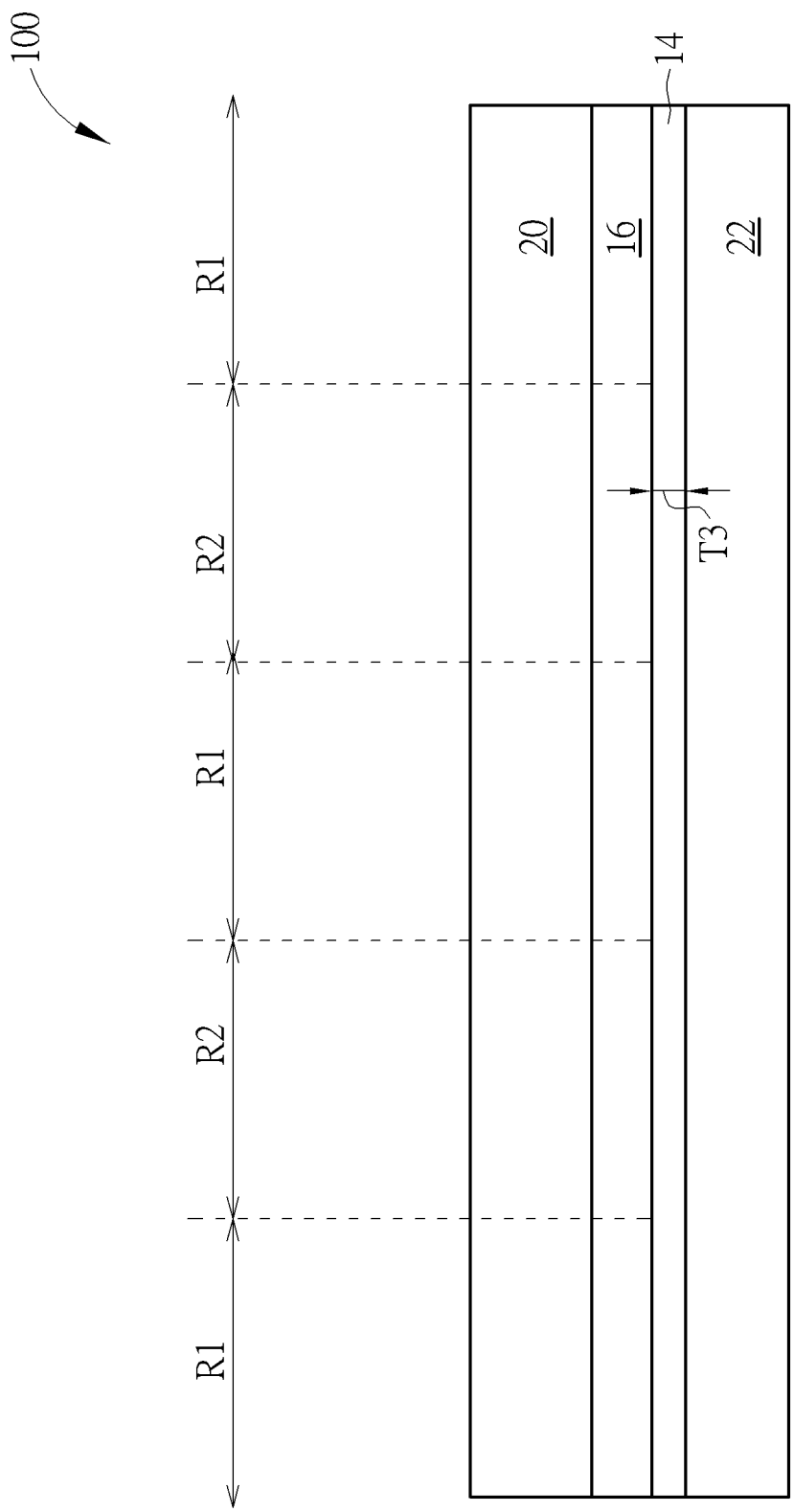

Please refer to FIG. 1, FIG. 6, and FIG. 7, wherein FIG. 6 and FIG. 7 are schematic cross-sectional views of an electronic device 100 at the manufacturing steps after the step shown in FIG. 1 according to a third embodiment of the present disclosure. After forming the electric circuit layer 16 on the flexible substrate 14 as shown in FIG. 1, a filling layer 20 is formed on the electric circuit layer 16. After that, the electronic device 100 is attached to a temporary substrate 26 on the side of the filling layer 20, and then the flexible substrate 14 is removed from the electric circuit layer 16. Following, a thinning process 27 is performed to thin the flexible substrate 14 from the thickness T1 to a thickness T3. The thinning process 27 may be an etching process or a polishing process, but is not limited thereto. According to some embodiments, the thickness T3 may be approximately between ½ and ⅕ of the thickness T1 of the flexible substrate 14. Following, as shown in FIG. 7, the thinned flexible substrate 14 is attached to a supporting film 22 and the temporary substrate 26 is removed. In the embodiment, by thinning the flexible substrate 14 to reduce the thickness of the flexible substrate 14 that the light passes through, the averaged light transmittance of the flexible substrate 14 may be increased and thus the electronic device 100 may overall have an improved transparency.

Figure 8:
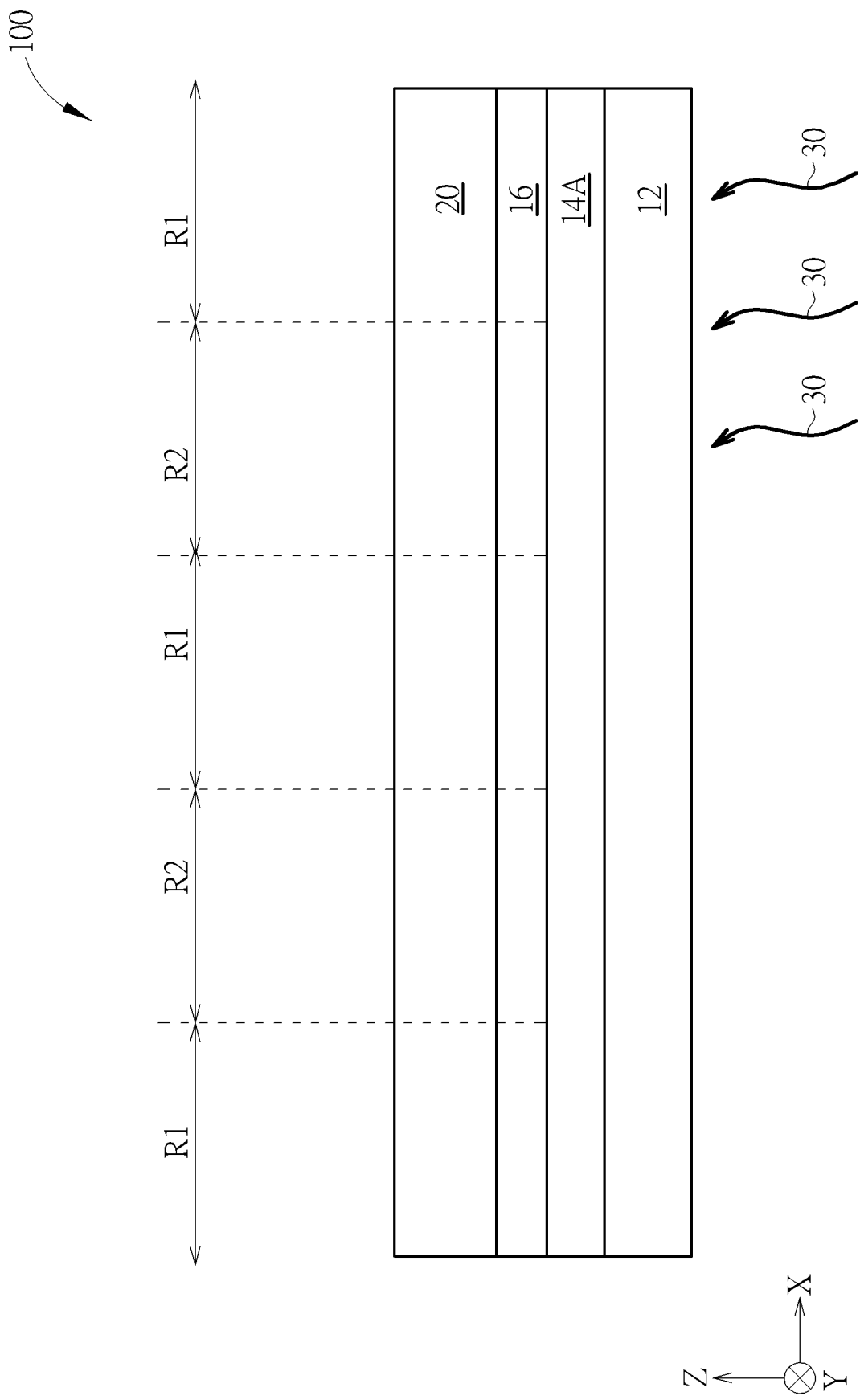
FIG. 8 and FIG. 9 are schematic cross-sectional views of an electronic device at the manufacturing steps after the step shown in FIG. 1 according to a fourth embodiment of the present disclosure.
Figure 9:
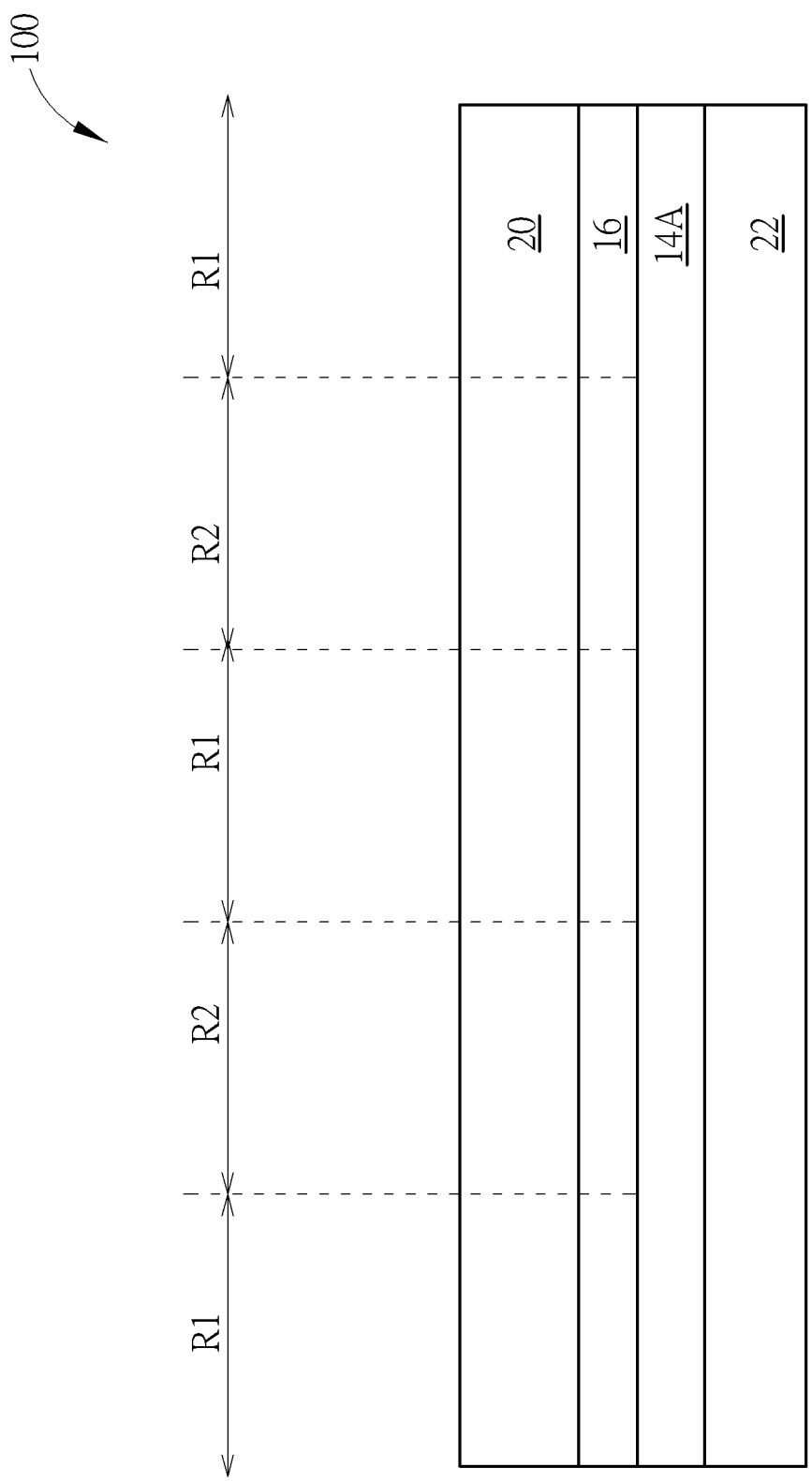

Please refer to FIG. 1, FIG. 8, and FIG. 9, wherein FIG. 8 and FIG. 9 are schematic cross-sectional views of an electronic device 100 at the manufacturing steps after the step shown in FIG. 1 according to a fourth embodiment of the present disclosure. After forming the electric circuit layer 16 on the flexible substrate 14 as shown in FIG. 1, a filling layer 20 is formed on the electric circuit layer 16. After that, a treatment process 30 is performed on the flexible substrate 14 to improve the transmittance of the flexible substrate 14. More specifically, the treatment process 30 may include applying an energy to the flexible substrate 14 to change a molecular structure of the flexible substrate 14 to convert the flexible substrate 14 to a flexible substrate 14A having a transmittance higher than the transmittance of the flexible substrate 14. For example, during the treatment process 30, a proper energy may be applied to the flexible substrate 14 to break the molecular bonds of the molecules of the flexible substrate 14. In some embodiments, the means of providing the energy may include laser treatment or thermal treatment to the flexible substrate 14, but is not limited thereto. The molecular structure of the flexible substrate 14A obtained by the treatment process 30 is different from the original molecular structure of the flexible substrate 14. The flexible substrate 14A may have a sixth transmittance TM6. According to some embodiments of the present disclosure, the sixth transmittance TM6 may be higher than 80%, or higher than 85%. Following, as shown in FIG. 9, a lift-off process may be performed to remove the flexible substrate 14A, the electric circuit layer 16, and the filling layer 20 from the carrier substrate 12, and then the flexible substrate 14A is attached to a supporting film 22 on a side of the flexible substrate 14A that is opposite to the electric circuit layer 16. In the embodiment, by changing the molecular structure of the flexible substrate 14 to convert the flexible substrate 14 to the flexible substrate 14A having increased light transmittance, the electronic device 100 may overall have an improved transparency.

Figure 10:
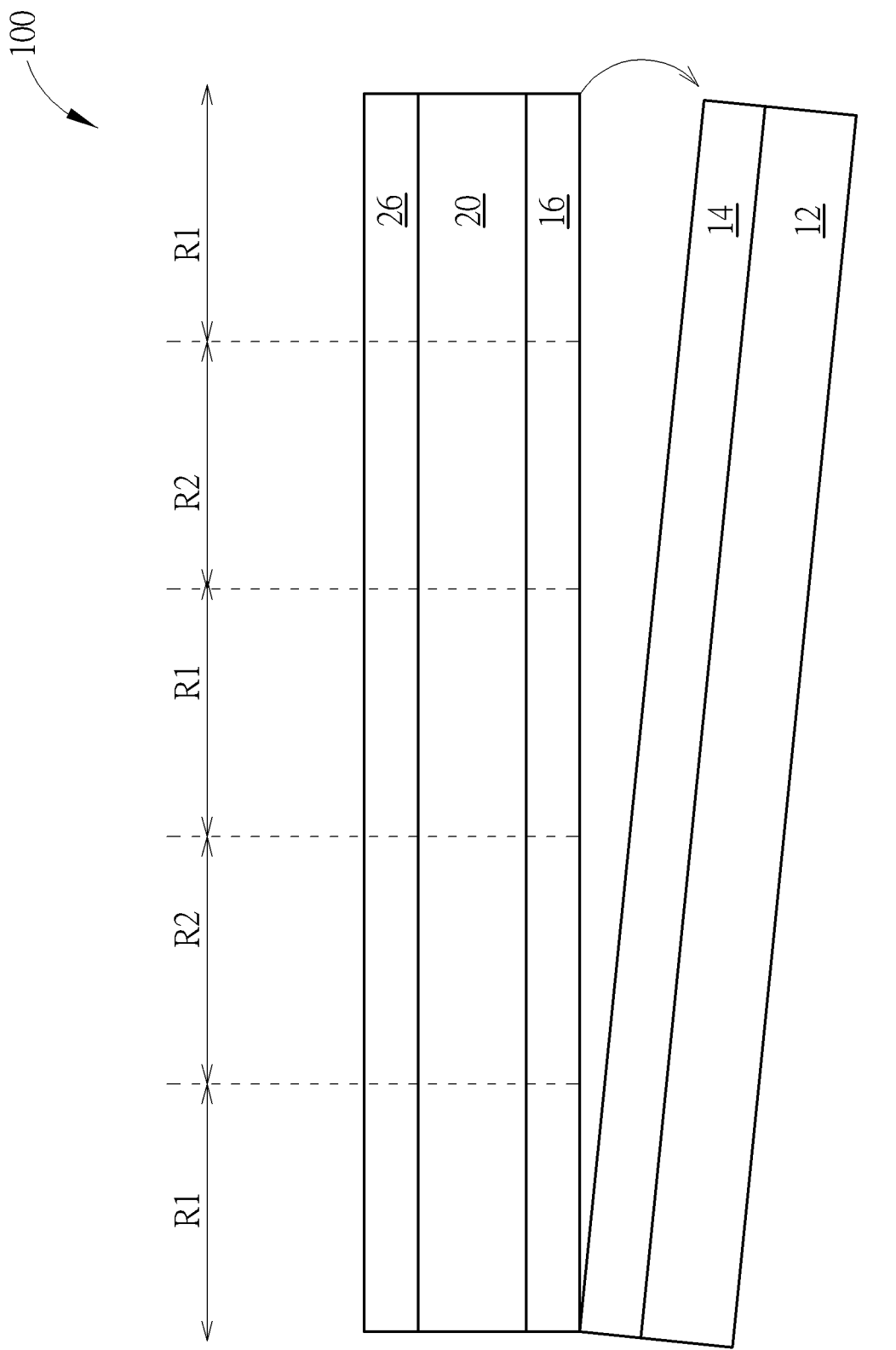
FIG. 10, FIG. 11 and FIG. 12 are schematic cross-sectional views of an electronic device at the manufacturing steps after the step shown in FIG. 1 according to a fifth embodiment of the present disclosure.
Figure 11:
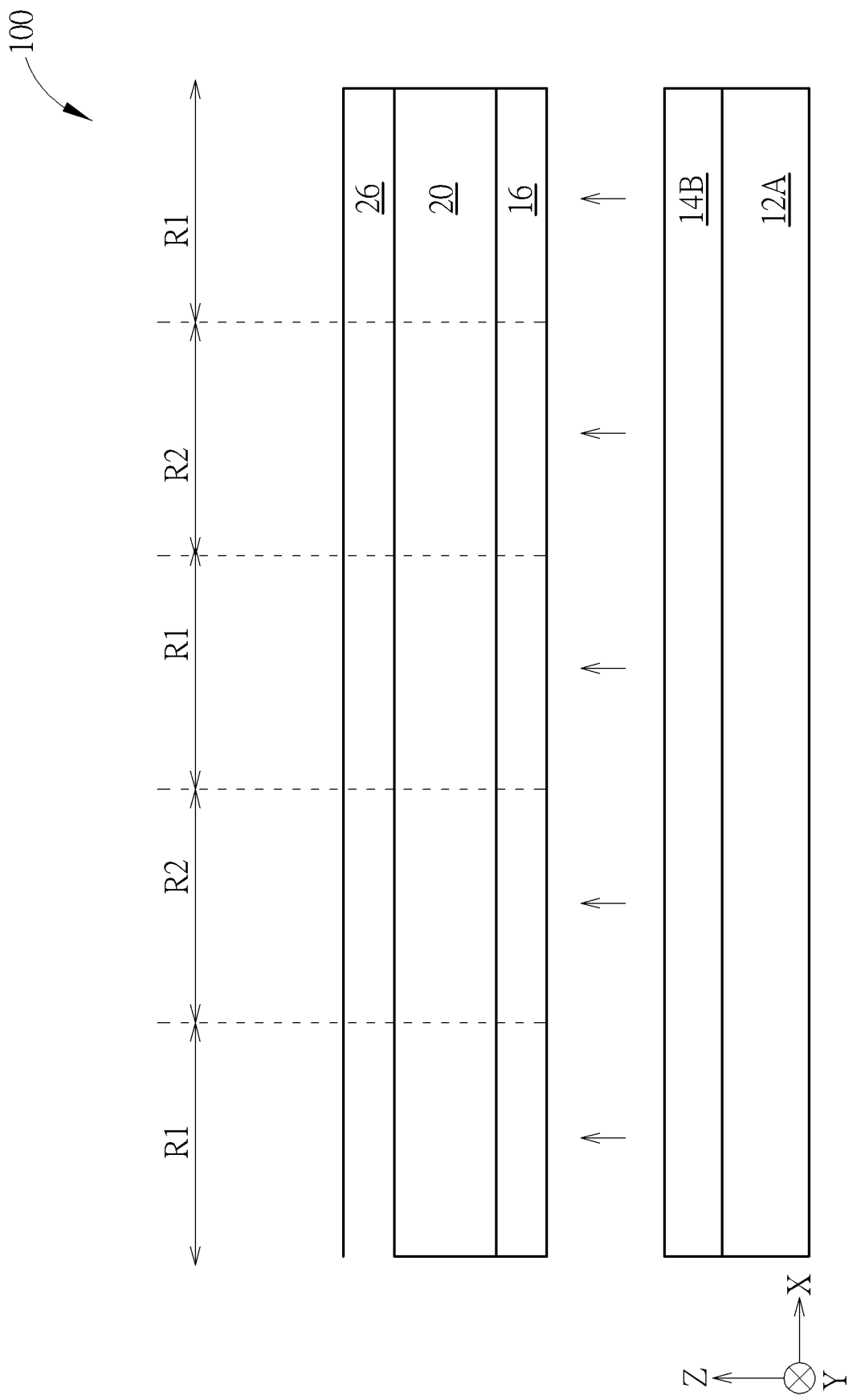
Figure 12:
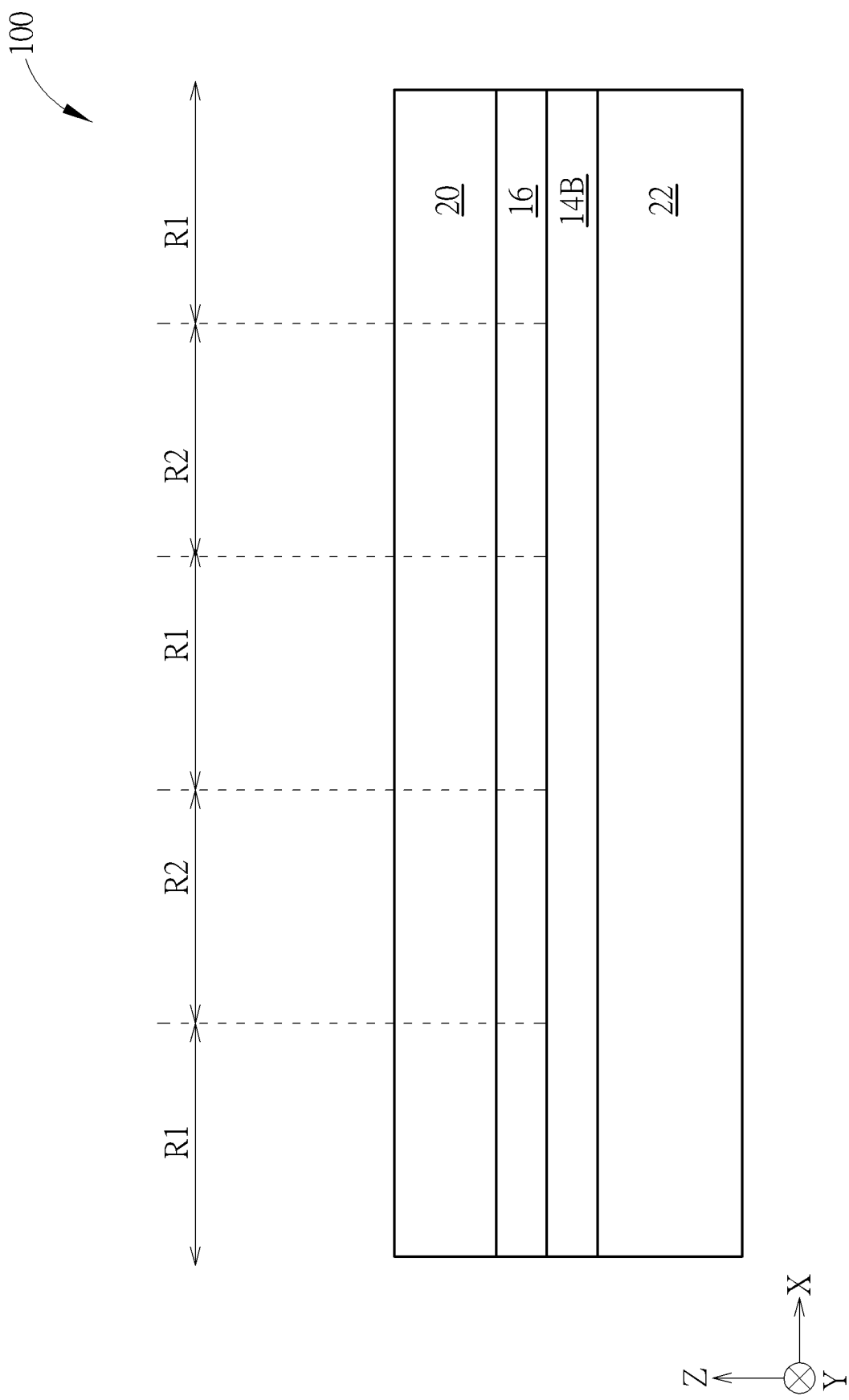

Please refer to FIG. 1, FIG. 10, FIG. 11, and FIG. 12, wherein FIG. 10, FIG. 11 and FIG. 12 are schematic cross-sectional views of an electronic device 100 at the manufacturing steps after the step shown in FIG. 1 according to a fifth embodiment of the present disclosure. As shown in FIG. 1 and FIG. 10, after forming the electric circuit layer 16 on the flexible substrate 14, a filling layer 20 is formed on the electric circuit layer 16, and the electronic device 100 is then attached to a temporary substrate 26 on the side of the filling layer 20. Subsequently, a lift-off process is performed to remove the flexible substrate 14 from the electric circuit layer 16. In some embodiments, a sacrificial layer (not shown) may be provided between the flexible substrate 14 and the electric circuit layer 16 to facilitate removing the flexible substrate 14 from the electric circuit layer 16 during the lift-off process. The sacrificial layer may be, for example, an amorphous silicon layer or a layer of hydrogen-containing material, but is not limited thereto. The lift-off process may be, for example, laser lift-off or mechanical lift-off, but is not limited thereto. Following, as shown in FIG. 11, a substrate 14B on another carrier substrate 12A (second carrier substrate) is attached to the electric circuit layer 16. In some embodiments, the substrate 14B may be a flexible substrate or a glass substrate that may have a seventh transmittance TM7. The seventh transmittance TM7 is higher than the first transmittance TM1 of the flexible substrate 14. According to some embodiments of the present disclosure, the seventh transmittance TM7 may be higher than 80%, or higher than 85%. Following, after lifting off the substrate 14B from the carrier substrate 12A, the substrate 14B is attached to a supporting film 22, and the then the temporary substrate 26 is removed. In the embodiment, by replacing the flexible substrate 14 with the substrate 14B having a higher transmittance (the transmittance TM7) after the elevated temperature process of forming the electric circuit layer 16, the electronic device 100 may overall have an improved transparency.

Figure 13:
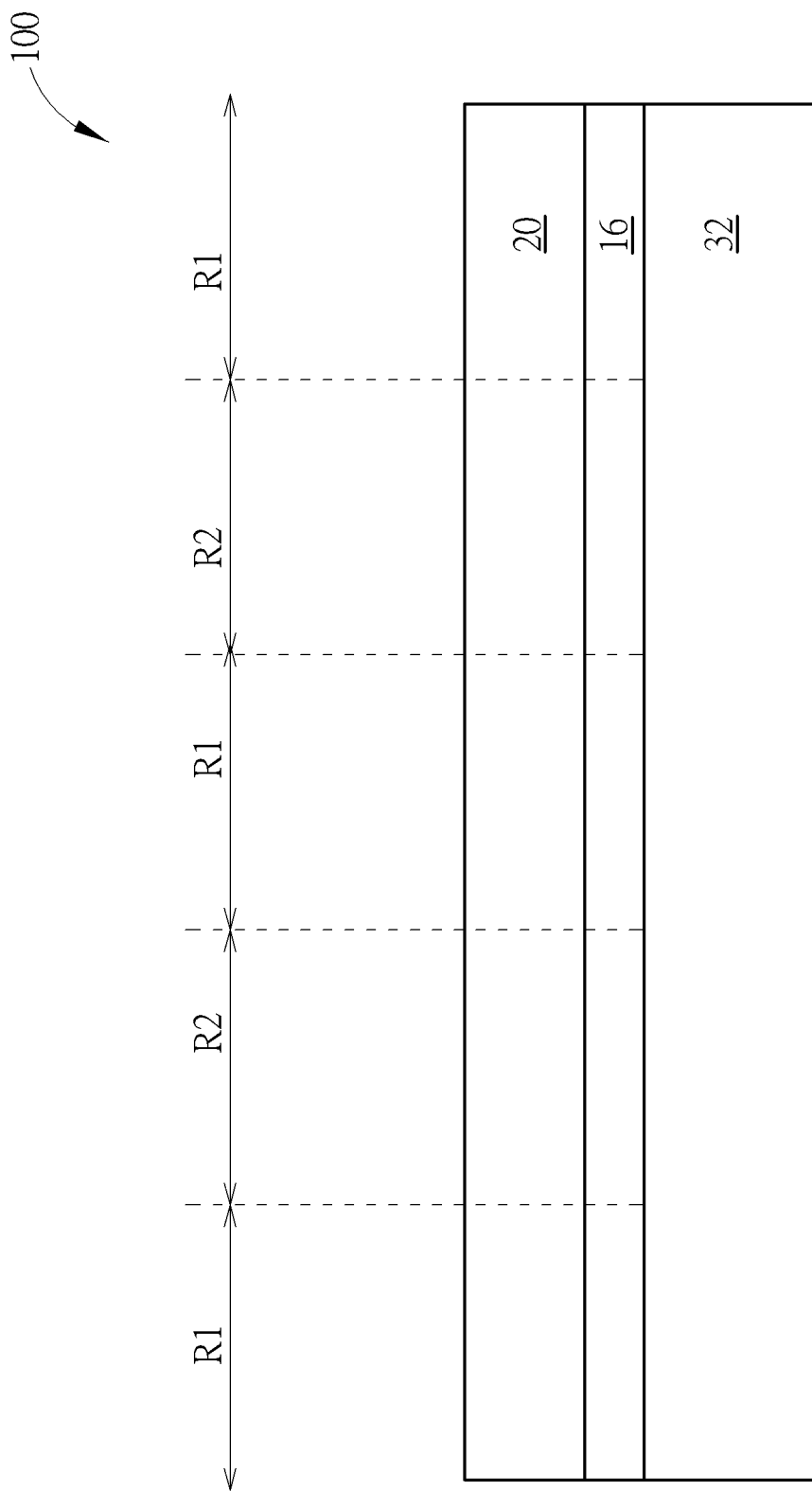
FIG. 13 is a schematic cross-sectional view of an electronic device according to a sixth embodiment of the present disclosure.

FIG. 13 is a schematic cross-sectional view of an electronic device according to a sixth embodiment of the present disclosure. In this embodiment, after forming the electric circuit layer 16 and the filling layer 20 on the flexible substrate 14, the electric circuit layer 16 and the filling layer 20 are lifted off from the flexible substrate 14 and then attached to a glass board 32. The glass board 32 may be used in the field of architecture, automobiles, interior decoration, signs, windows, or optical devices, but is not limited thereto. In this embodiment, the electronic device 100 omits the flexible substrate, and therefore may overall have an improved transparency.

Figure 14:
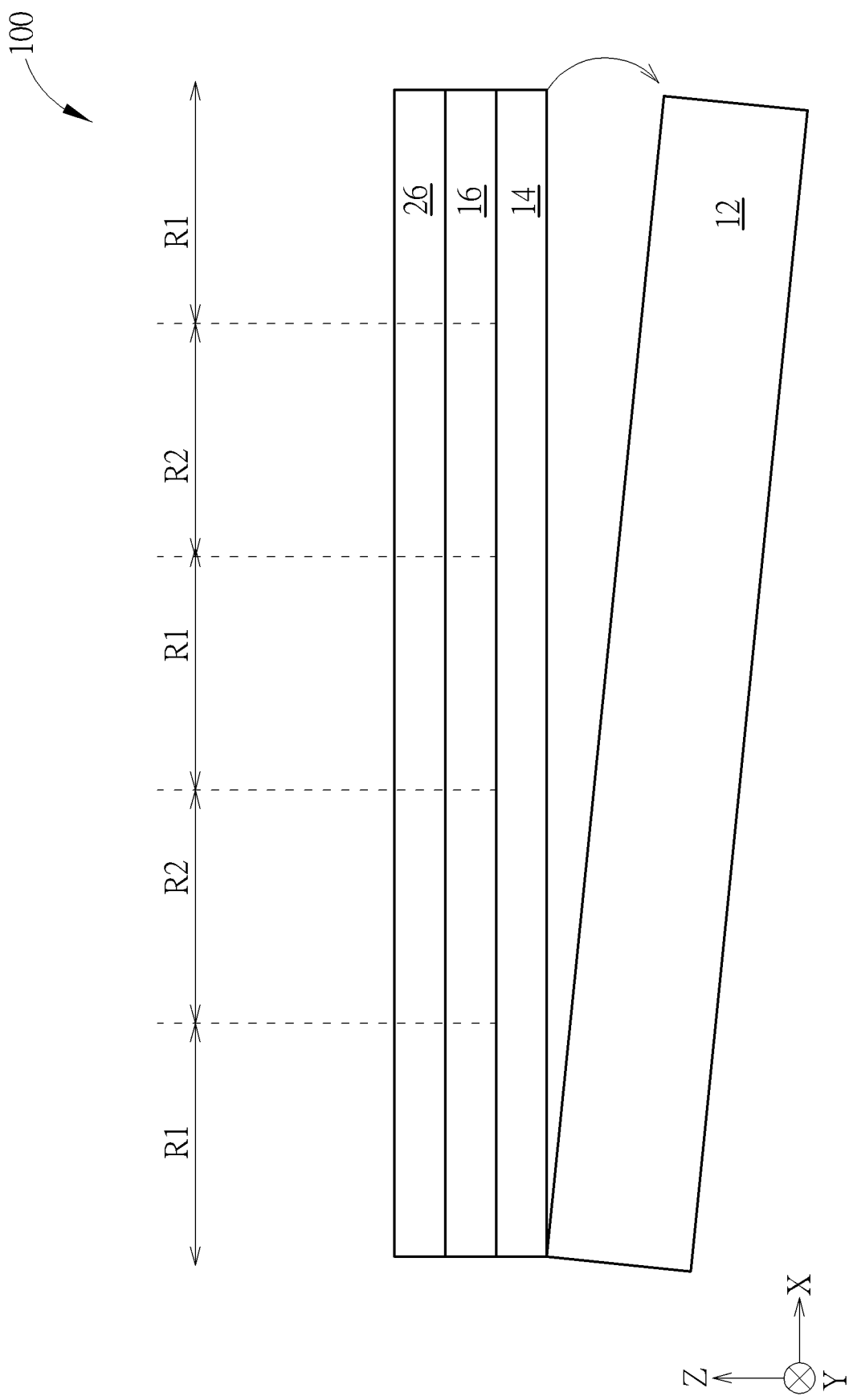
FIG. 14, FIG. 15, FIG. 16, and FIG. 17 are schematic cross-sectional views of an electronic device at the manufacturing steps after the step shown in FIG. 1 according to a seventh embodiment of the present disclosure.
Figure 15:
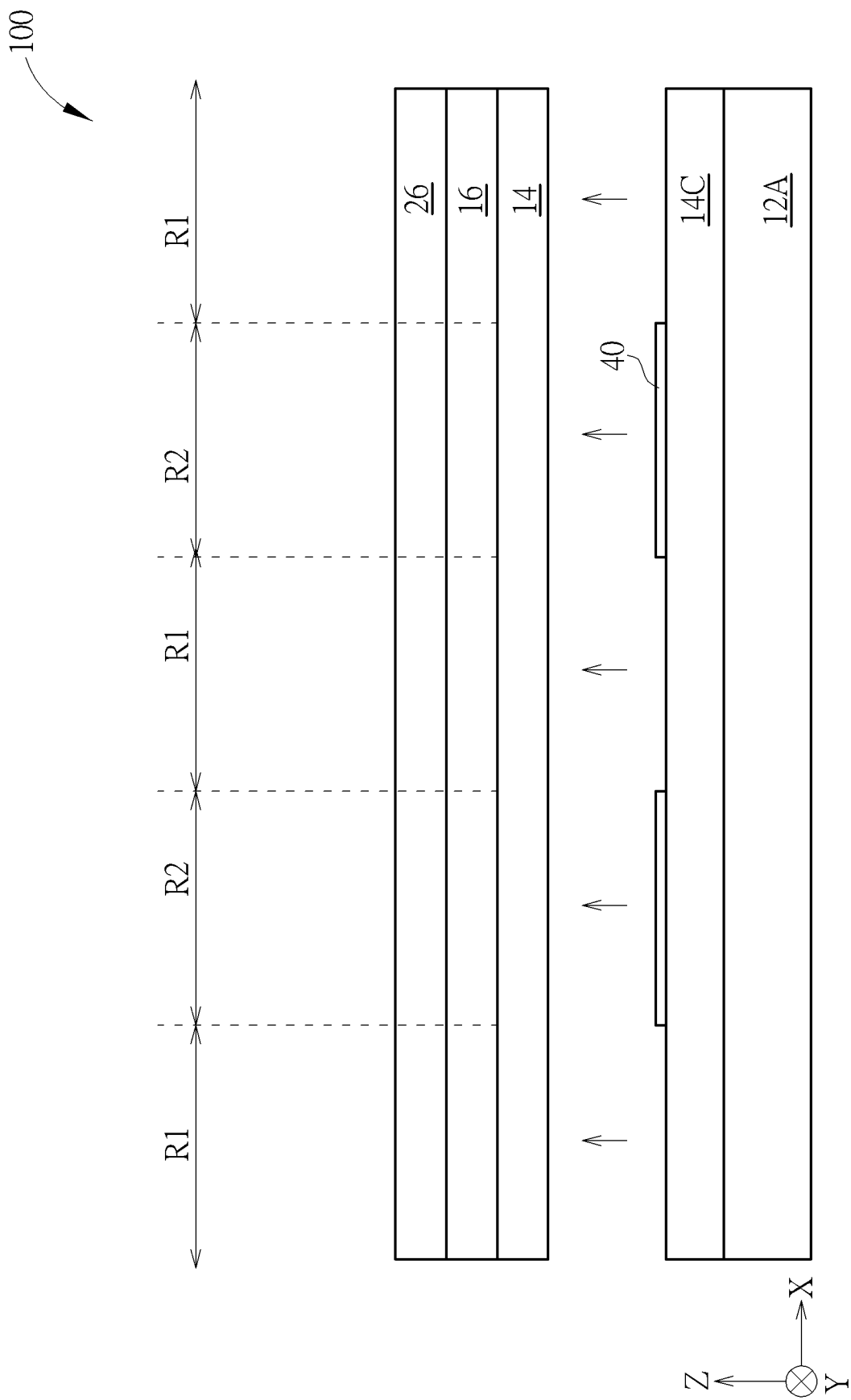

Please refer to FIG. 1, FIG. 14, FIG. 15, FIG. 16 and FIG. 17, wherein FIG. 14, FIG. 15, FIG. 16, and FIG. 17 are schematic cross-sectional views of an electronic device at the manufacturing steps after the step shown in FIG. 1 according to a seventh embodiment of the present disclosure. As shown in FIG. 1 and FIG. 14, after forming the electric circuit layer 16 on the flexible substrate 14, the electric circuit layer 16 is attached to a temporary substrate 26, and the flexible substrate 14 is then lifted-off from the carrier substrate 12. Following, as shown in FIG. 15, a flexible substrate 14C (second flexible substrate) on a carrier substrate 12A (second carrier substrate) and having etch stop layers 40 disposed thereon is provided, and the flexible substrate 14 is attached to the flexible substrate 14C in a manner that the etch stop layers 40 is disposed between the flexible substrate 14 and the flexible substrate 14C. The flexible substrate 14C may have an eighth transmittance TM8, and the eighth transmittance TM8 is higher than the first transmittance TM1 of the flexible substrate 14. According to some embodiments of the present disclosure, the eighth transmittance TM8 may be higher than 80%, or higher than 85%. The etch stop layers 40 includes a material different from the material of the flexible substrate 14, and have a high transmittance and an etching selectivity with respect to the flexible substrate 14. In some embodiments, the material of the etch stop layers 40 may include, for example, silicon oxide and/or silicon nitride, but is not limited thereto. The transmission of the etch stop layers 40 may be higher than 80%, or higher than 85%.

Figure 16:
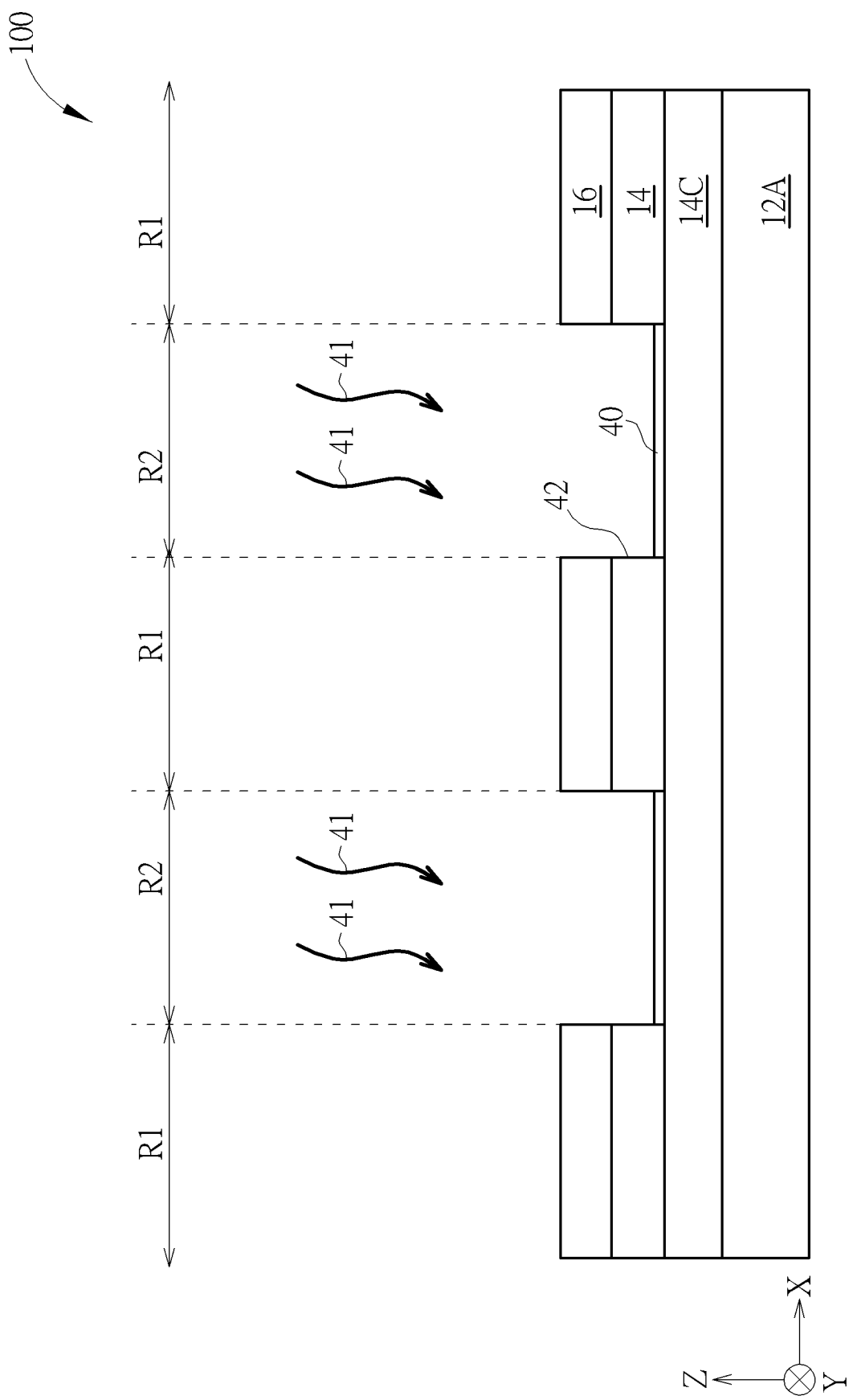

Afterward, as shown in FIG. 16, the temporary substrate 26 is removed, and an etching process 41 (for example, a photolithography-etching process) may be performed to etch the electric circuit layer 16 and the flexible substrate 14 in the second region R2 to form a plurality of openings 42 in the electric circuit layer 16 and the flexible substrate 14, wherein the etch stop layers 40 are exposed from the openings 42.

Figure 17:
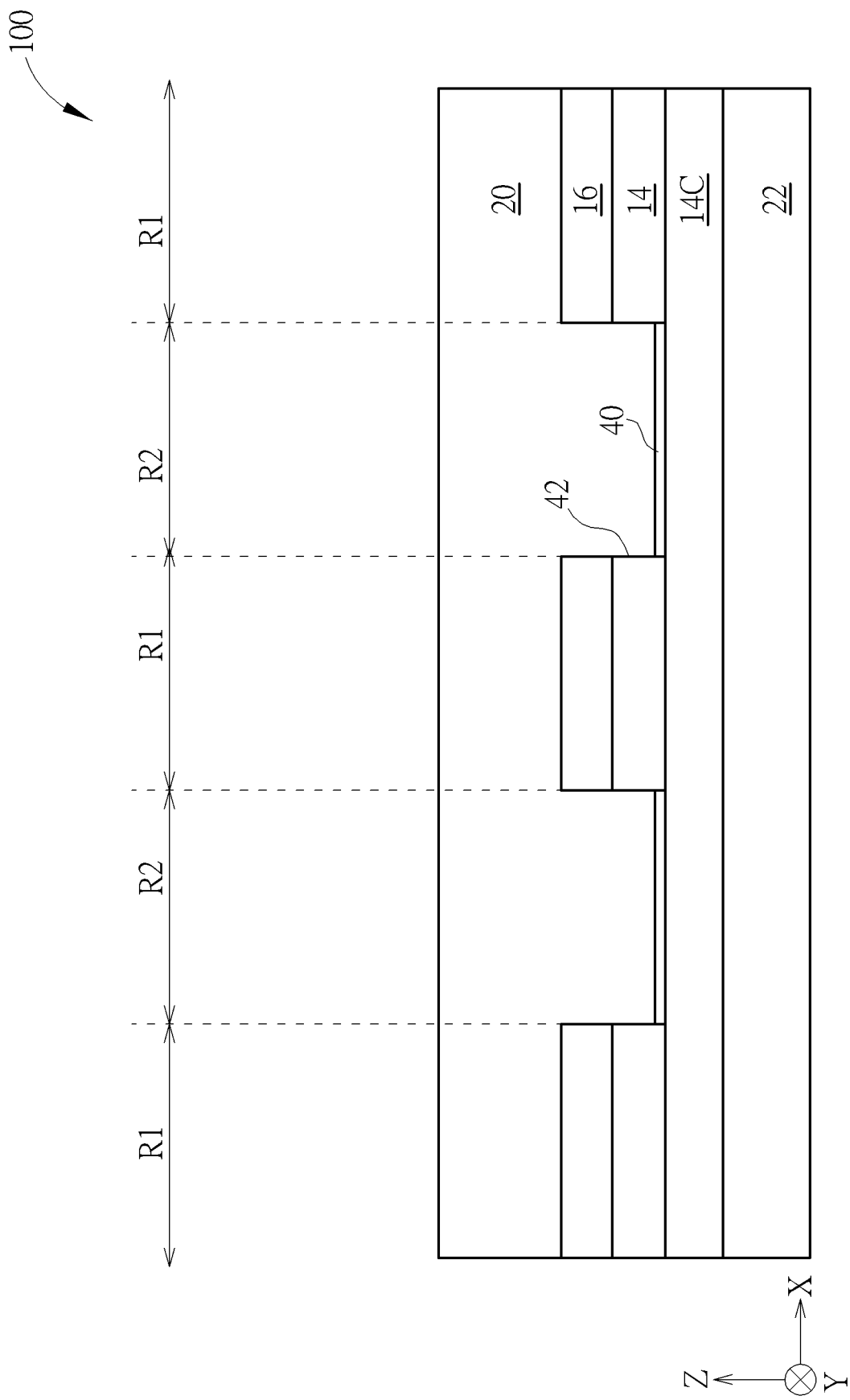

Following, as shown in FIG. 17, a filling layer 20 is formed and covers the electric circuit layer 16 and the flexible substrate 14, and is filled into each of the openings 42 in the second regions R2. After the flexible substrate 14C, the flexible substrate 14, the electric circuit layer 16, and the filling layer 20 are lifted-off from the carrier substrate 12A, the flexible substrate 14C is attached to a supporting film 22 on a side of the flexible substrate 14C opposite to the flexible substrate 14. Alternatively, in other embodiments, the flexible substrate 14C, the flexible substrate 14, the electric circuit layer 16, and the filling layer 20 may be lifted off from the carrier 12 and attached to the supporting film 22, and then the etching process 41 is performed to form the openings 42. In this embodiment, the electronic device 100 includes two flexible substrates that are the flexible substrate 14 and the flexible substrate 14C for additional support, and includes openings 42 formed in the flexible substrate 14 in the second regions R2 and filled by the filling layer 20 with a higher light transmittance with respect to the flexible substrate 14, the averaged light transmittance of the flexible substrate 14 may be increased and thus the electronic device 100 may overall have an improved transparency.

Figure 19:
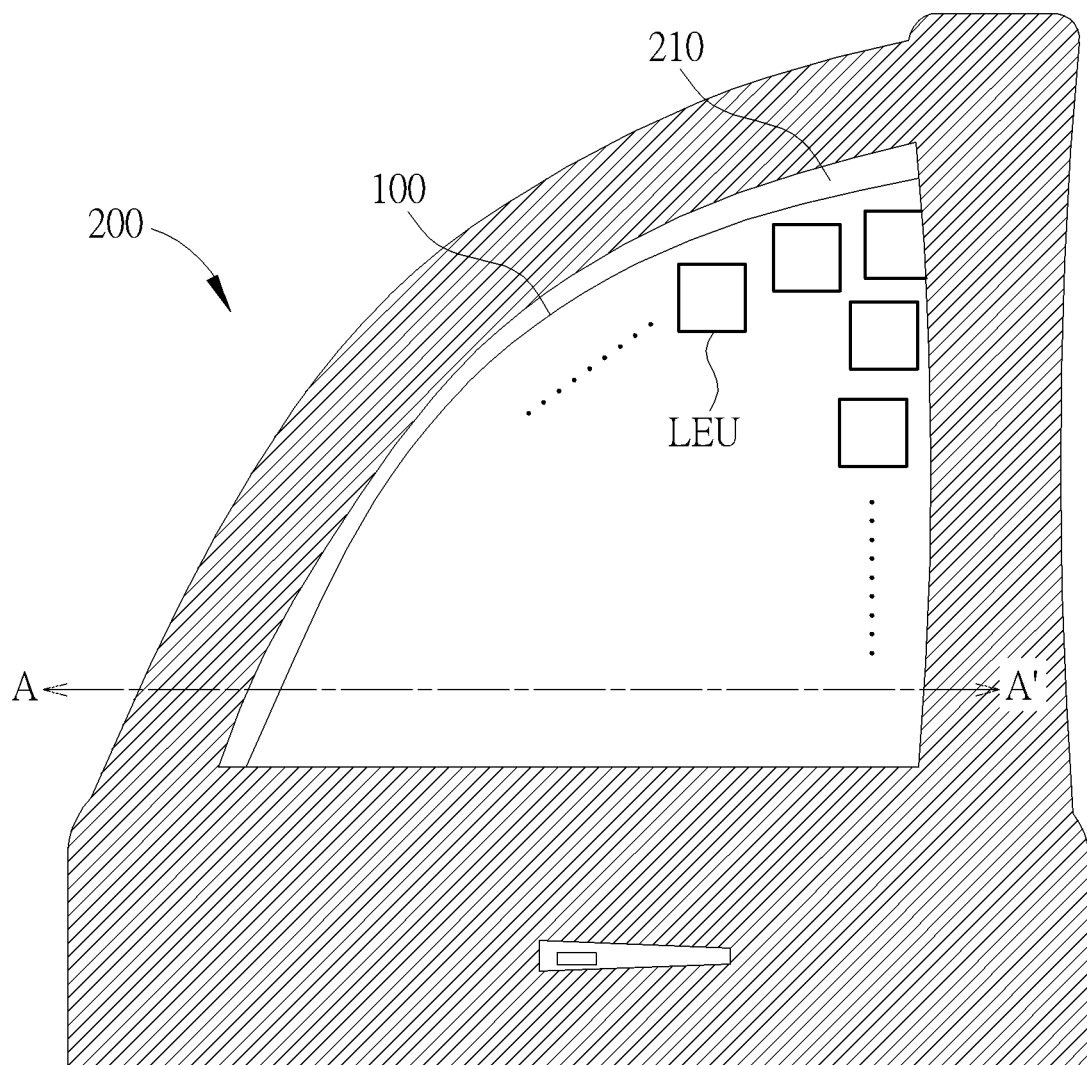
FIG. 19 and FIG. 20 are schematic diagrams illustrating some examples of applying the electronic devices provided by various embodiments of the present disclosure in a mobile window glass.

FIG. 19 shows a schematic diagram of a portion of an automotive door 200, illustrating an example of the electronic devices 100 provided by the present disclosure being applied to a window glass 210 of the automotive door 200. As shown in FIG. 19, the electronic devices 100 may have a profile that matches the shape of the window glass 210. In some embodiments, the light emitting units LEU (or pixel units) of the electronic device 100 may be arranged according to the profile of the electronic device 100 to match the shape of the window glass 210. It should be understood that the shapes and dimensions of the components shown in FIG. 19 are for illustration purposes only and are not drawn to scale. The light emitting units LEU may be, for example, organic light emitting diodes (OLEDs), micro light emitting diodes (micro-LEDs), or sub-millimeter light emitting diodes (mini LEDs), but are not limited thereto.

Figure 20:
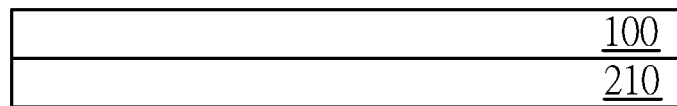
Figure 20:
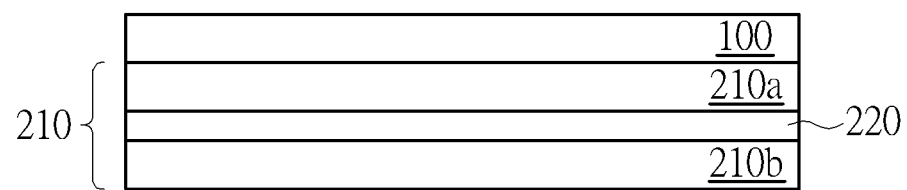
Figure 20:
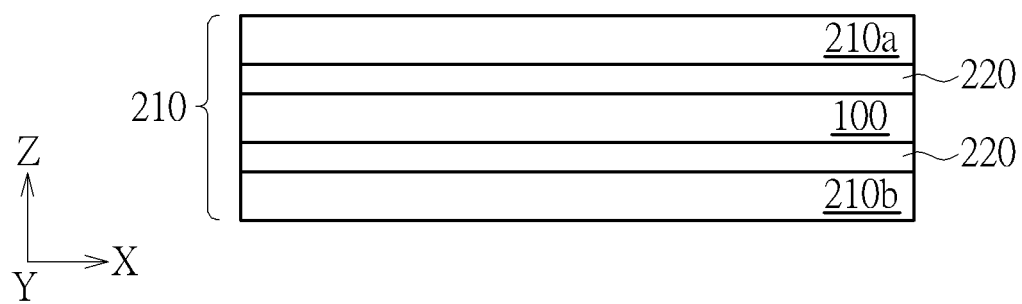

FIG. 20 shows some schematic cross-sectional views of the window glass 210 along the line A-A' as shown in FIG. 19 according to some embodiments of the present disclosure. The window glass 210 (or glass for other applications) may be a monolithic glass or a laminated glass, but is not limited thereto. For example, as shown in part (A) of FIG. 20, when the window glass 210 is a monolithic glass, the electronic device 100 may be disposed directly or through an adhesive layer (not shown) on at least one side of the window glass 210. As shown in part (B) of FIG. 20, when the window glass 210 is a laminated glass formed by laminating a glass board 210a and a glass board 210b by an adhesive layer 220, the electronic device 100 may be disposed directly or an adhesive layer (not shown) on the an outer surface of the glass board 210a and/or the glass board 210b that faces outside. Alternatively, the electronic device 100 may be disposed between glass board 210a and the glass board 210b by attaching the glass board 210a and the glass board 210b to two sides of the electronic device 100 by the adhesive layers 220.

In summary, the present disclosure is directed to improve the problem of insufficient transparency of an electronic device caused by using a heat-resistant flexible substrate. Particularly, means for improving the transparency are performed after forming the electric circuit layer of the electronic device. According to the embodiments of the present disclosure, the means for improving the transparency may include performing an etching process to etch the flexible substrate to form openings or recesses in the flexible substrate, thinning the flexible substrate, changing the molecular structure of the flexible substrate, or replacing the flexible substrate with another flexible substrate having a higher transmittance or a glass board. In the embodiments where the transparency is improved by performing an etching process to the flexible substrate, the flexible substrate may be attached to another flexible substrate having a higher transmittance before being etched for obtaining additional support. The electronic device provided by the present disclosure may have an increased transmittance, so that an improved transparency of the electronic device may be achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device comprising a first region and a transparent region, the method comprising:
   providing a flexible substrate;
   forming an electric circuit layer on the flexible substrate at an elevated temperature;
   after forming the electric circuit layer, forming an opening in the transparent region, and the opening penetrating through a portion of the electric circuit layer, and
   after forming the opening, forming a filling layer on the flexible substrate, wherein at least a part of the filling layer is formed in the opening to enhance a transmittance of the transparent region.

2. The method according to claim 1, wherein the elevated temperature is equal to or higher than 200° C.

3. The method according to claim 1, wherein the filling layer comprises an organic material.

4. The method according to claim 1, wherein the filling layer comprises an inorganic material.

5. The method according to claim 1, wherein the filling layer comprises an organic material and an inorganic material.

6. The method according to claim 1, further comprising forming a light emitting unit on the electric circuit layer in the first region.

7. The method according to claim 6, wherein the light emitting unit comprises an organic light emitting diode.

8. The method according to claim 1, wherein the electric circuit layer comprises a driving circuit in the first region.

9. The method according to claim 1, wherein another part of the filling layer is formed on the electric circuit layer in the first region.

* * * * *